United States Patent
Fujisaki et al.

[11] Patent Number: 5,942,048
[45] Date of Patent: *Aug. 24, 1999

[54] PHOTOVOLTAIC ELEMENT ELECTRODE STRUCTURE THEREOF AND PROCESS FOR PRODUCING THE SAME

[75] Inventors: Tatsuo Fujisaki, Nara; Akio Hasebe, Kyoto; Tsutomu Murakami, Nara; Koji Tsuzuki, Kyoto; Hirofumi Ichinose, Kyoto; Takeshi Takada, Kyoto; Yoshifumi Takeyama, Kyoto; Satoshi Shinkura, Kyoto, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/897,105

[22] Filed: Jul. 18, 1997

Related U.S. Application Data

[63] Continuation of application No. 08/442,762, May 17, 1995, abandoned.

[30] Foreign Application Priority Data

| May 19, 1994 | [JP] | Japan | 6-105249 |
| Jun. 7, 1994 | [JP] | Japan | 6-125376 |
| Jun. 23, 1994 | [JP] | Japan | 6-108113 |
| Jul. 29, 1994 | [JP] | Japan | 6-178908 |
| Jul. 29, 1994 | [JP] | Japan | 6-178909 |

[51] Int. Cl.$^6$ .................. H01L 31/0224; H01L 31/05
[52] U.S. Cl. .................. 136/256; 136/244; 438/98; 257/459
[58] Field of Search .................. 136/244, 256; 438/98; 257/459

[56] References Cited

U.S. PATENT DOCUMENTS

| 4,260,429 | 4/1981 | Moyer | 136/256 |
| 4,283,591 | 8/1981 | Boer | 136/256 |
| 4,426,546 | 1/1984 | Hotta et al. | 136/256 |
| 4,443,652 | 4/1984 | Izu et al. | 136/251 |
| 4,612,410 | 9/1986 | Hewig | 136/256 |
| 4,695,674 | 9/1987 | Bar-on | 136/256 |
| 4,959,106 | 9/1990 | Nakagawa et al. | 136/258 |
| 5,084,107 | 1/1992 | Deguchi et al. | 136/256 |
| 5,181,968 | 1/1993 | Nath | 136/256 |
| 5,279,681 | 1/1994 | Matsuda | 136/255 |
| 5,324,364 | 6/1994 | Matsuda et al. | 136/249 |
| 5,340,409 | 8/1994 | Tsuzuki et al. | 136/256 |

FOREIGN PATENT DOCUMENTS

3-22574  1/1991  Japan .

OTHER PUBLICATIONS

Patent Abstracts of Japan, vol. 18, No. 425 (E–1590), Aug. 9, 1994.

*Primary Examiner*—ALan Diamond
*Attorney, Agent, or Firm*—Fitzpatrick, Cella, Harper & Scinto

[57] ABSTRACT

A photovoltaic device is provided which comprises at least one metal wire on a surface of a photovoltaic element for collecting the power generated by the photovoltaic element, the at least one metal wire being coated with an electroconductive adhesive over the entire length and fixed onto the photovoltaic element. The photovoltaic device is produced without applying and curing the electroconductive adhesive in the photovoltaic device production process at low cost with high reliability.

23 Claims, 14 Drawing Sheets

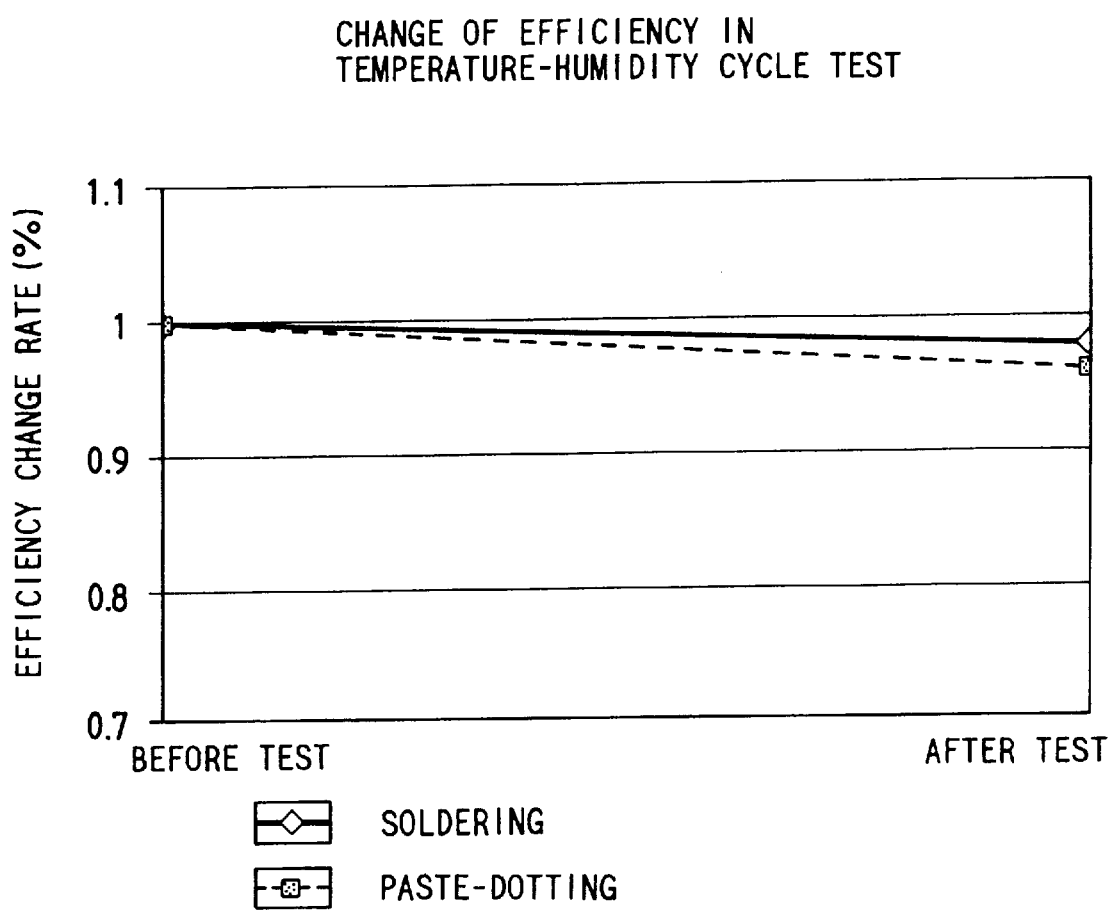

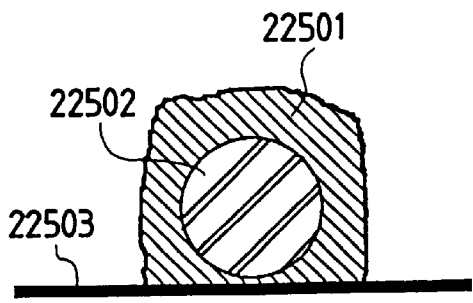
EXAMPLE 5-1
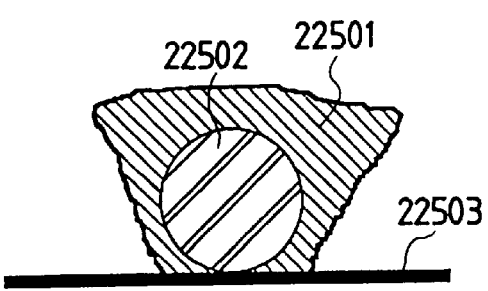
COMPARATIVE
EXAMPLE 5-1
FIG. 23
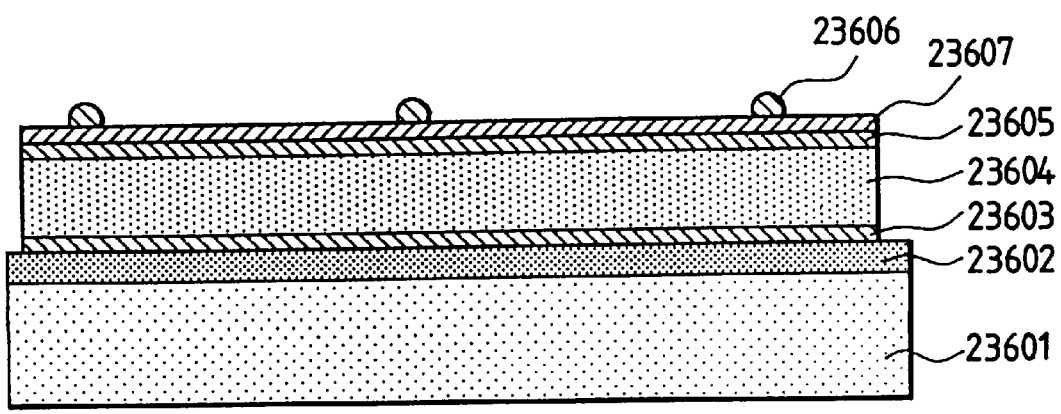

PHOTOVOLTAIC ELEMENT ELECTRODE STRUCTURE THEREOF AND PROCESS FOR PRODUCING THE SAME

This application is a continuation of application Ser. No. 08/442,762 filed May 17, 1995 which is now abandoned.

BACKGROUND OF THE INVENTION

1. Field of the Invention

The present invention relates to photovoltaic element useful as a solar cell or the like, the structure of an electrode thereof, and a process for producing the photovoltaic device.

2. Related Background Art

In recent years, the global temperature rise caused by increase of carbon dioxide in the atmosphere, namely the greenhouse effect, has become a great problem. Therefore, clean energy sources are increasingly demanded. Nuclear power generation which does not cause the greenhouse effect involves the problem of disposal of radioactive waste. A safer and cleaner energy source is thus required.

Among promising clean energy sources, solar cells are attracting particular attention because of the safety, cleanness, and ease of handling thereof.

Of the solar cells, amorphous silicon type solar cells which employ an amorphous silicon semiconductor are promising because they have advantages of ease of large area cell production, high light absorbance enabling thin film operation, and so forth, although the photovoltaic conversion efficiency is lower than that of crystalline silicon type solar cells.

FIGS. 24A to 24D illustrate schematically a conventional photovoltaic element for comparison with the one of the present invention. FIGS. 24A to 24C illustrate the steps of forming a collecting electrode, and FIG. 24D is a cross-sectional view along the line 24D—24D in FIG. 24C. The solar cell element 500 of FIGS. 24A to 24D is prepared by successively laminating a lower electrode layer 502 on the surface of a substrate 501, a semiconductor layer 503 thereon, and an upper electrode layer 504 further thereon.

In such a solar cell element, in order to completely electrically separate the upper electrode layer from the lower electrode layer, a part 505 of the upper electrode layer is removed, and collecting electrodes 506 for the upper electrode layer 504 are provided on the surface of the upper electrode layer (FIG. 24A). In one method, for example, the collecting electrodes 506 are prepared by applying an electroconductive paste on the face of the photovoltaic laminate by screen printing and heat curing it. By this method, electrodes having a line width of 100 to 150 $\mu$m, and thickness of 10 to 20 $\mu$m are obtainable industrially. The electroconductive paste includes various materials. For amorphous silicon type solar cells, for which high temperature treatment is not suitable, polymer pastes comprising a thermosetting resin such as of polyester, epoxy and phenolic type, and a fine particulate material such as silver and copper dispersed therein are frequently used.

On the collecting electrodes 506 a bus bar electrode 507 is provided which further collects the generated power from the above collecting electrode 506 (FIG. 24B). Then crossing points of the bus bar electrode 507 over the collecting electrodes 506 are connected by applying an electroconductive adhesive 508 in spots and curing it in an air drier (FIG. 24C). Thus a leadout electrode which outputs the power from the upper electrode 504 is prepared by electrically connecting the collecting electrodes 506 with the bus bar electrode 507. Insulation tapes 509 are applied at the ends of the solar cell element 500 to ensure electrical separation of the bus bar electrode 507 from the substrate.

In producing this type of element, three steps are necessary: (1) registration of bus bar electrode to a prescribed position, (2) application of an electroconductive adhesive in spots at prescribed positions with the bus bar electrode fixed, and (3) curing the electroconductive adhesive by heating in an air drier or an IR oven. The steps involve many working operations and take a long time, and thus are disadvantageously not suitable for mass production. In the example shown in FIGS. 24A and 24B, the problems are not so serious since the area of the photovoltaic element is small and the number of the collecting electrodes is small. However, in the production of a photovoltaic element of a larger area, the number of the collecting electrodes is larger and a plurality of the bus bar electrodes are necessarily employed. In such a case, the electrically connected points increase in number and the working time becomes correspondingly longer, which is undesirable in respect of productivity.

Usual family consumption of electric power is about 3 KW per family. To supply 3 KW of power by means of solar cells, the solar cell needs to have a light-receiving area of as large as 30 m$^2$, by assuming the photovoltaic conversion efficiency of the cell to be 10%. Such a large solar cell is required to have a bus bar to collect the generated power, which increases the cell element production steps. The larger the number of the production steps, and the larger the area of the cell, the more the defects of the element are developed. The defects cause shunting and short circuits which lower the photovoltaic conversion efficiency. If the defect is distant from the electrodes or the bus bar, loss of current is relatively small because of high resistance to the current flowing into the defective portion. On the other hand, if the defect is beneath the electrode or the bus bar, the loss of current is large.

To solve these problems, electrode constructions are disclosed which are suitable for a large-area solar cell without using the bus bar. For example, U.S. Pat. No. 4,260,429 discloses a process in which a copper wire is covered with a solid polymer containing electroconductive particles and is attached as the electrode to a solar cell. U.S. Pat. No. 5,084,107 discloses a process in which a metal wire is connected and fixed by an electroconductive adhesive to a surface of a photovoltaic element. In these methods, the electrode is formed by covering an electroconductive wire with an electroconductive particle-containing solid polymer (electroconductive adhesive) with a low ohmic loss even with an electrode length of 10 cm or more.

However, in a study of electrode constitution and reliability of solar cells conducted by the inventors of the present invention, it was found that the electrodes formed by the methods of the above U.S. Patents are insufficient in adhesion at the interface between the electroconductive wire or the metal member and the electroconductive particle-containing solid polymer or the electroconductive adhesive, and the electrodes are not uniform in the width or diameter. The insufficient adhesion at the interface between the electroconductive wire or the metal member and the electroconductive adhesive causes initial power loss, increase of series resistance by peeling at the interface in a long-term run, resulting in a drop in conversion efficiency, and other problems in reliability. Further, in the above elements, shunting and low yield may be caused, depending on the resistance of the electrode layer formed from the electroconductive adhesive, and disadvantageous migration of ionic substances may be caused by interaction with water, resulting in leakage due to humidity in practical use.

In the above U.S. Patents, the coated wires are bonded by heating or pressing, but neither the apparatus nor the method are shown specifically. However, it has been found that the usual method of heat-press bonding causes spreading of the coating polymer, which increases shadow loss, and particularly in a large-area photovoltaic element, the pressure applied to the coated wire becomes non-uniform to give non-bonded portions which disadvantageously increase the series resistance.

Electrical connection is now further considered for outputting the generated power of the photovoltaic element.

FIG. 17 is a schematic plan view of a photovoltaic element from the front side (light-receiving side) for comparison. The photovoltaic element of FIG. 17 is constituted by an electroconductive substrate for supporting the entire photovoltaic element, a non-crystalline semiconductor layer, an electrode layer, collecting electrodes, and lead-out terminals successively formed over the substrate. The electroconductive substrate is made of a metallic material such as stainless steel. The semiconductor layer is constituted by a back-face reflection layer, a p-type semiconductor layer, an i-type semiconductor layer, and an n-type semiconductor layer successively arranged from the bottom layer. These semiconductor layers are formed and laminated by a film-forming method such as CVD (chemical vapor deposition) so that the light may be efficiently absorbed and converted to electric power. The aforementioned electrode layer is a light-transmissive electroconductive film made of indium oxide or the like, serving both as a reflection-preventing means and as a power-collecting means.

The light-transmissive electroconductive film is formed by application of an etching-paste containing $FeCl_3$, and $AlCl_3$, or the like by screen printing, and subsequent heating. An etched groove 17401 is formed by removing the light-transmissive electroconductive film by etching in a line shape. This partial removal of the light-transmissive electroconductive film is conducted for preventing short circuits between the substrate and the light-transmissive electroconductive film on the effective light-receiving area of the photovoltaic element. Such short-circuits may occur in cutting of the outer periphery of the photovoltaic element.

On the surface of the above photovoltaic element, collecting electrodes 17402 are formed for efficiently collecting the generated power. The collecting electrodes 17402 are formed by using a fine metal wire of low resistance such as copper as the core material, applying an electroconductive adhesive on the outer surface of the metal wire for adhesion, drying the adhesive, cutting the wire in a predetermined length, arranging the cut wires, and heat-bonding the wires on the surface of the effective light-receiving area by hot pressing.

The power collected by the collecting electrode 17402 is transmitted to lead-out terminals 17403 provided on both ends of the element. The lead-out terminals 17403 are foils made of a low-resistance metal such as copper, with an insulating member 17404 as the lowest layer to insulate the foils from the surface of the photovoltaic element.

The connection between the collecting electrodes 17402 and the lead-out terminals 17403 is conducted by spot-like application of an electroconductive adhesive 17405 to ensure reliable connection.

This process involves the problems of: necessity of spot-like application of an electroconductive adhesive, requiring a heat-curing step for curing the electroconductive adhesive, thereby increasing the working steps, taking a long time, and requiring a complicated apparatus for conducting these steps; the high cost of the electroconductive adhesive; the protrusion of the spot-wise applied electroconductive adhesive requiring a thick surface coating material, thus raising the production cost; deterioration of the surface of the terminal material such as copper by oxidation and other causes during the heating process of the element prior to the application of the electroconductive adhesive, whereby a sufficiently low connection resistance is not obtained by the application of the electroconductive adhesive.

SUMMARY OF THE INVENTION

The present invention provides an electrode structure for a photovoltaic element in which the connection between the collecting electrodes and the lead-out electrode is made in a simpler connecting step with retention of the electric characteristics such as produced by use of an electroconductive adhesive, and which is suitable for a mass production line. The present invention also provides a process for producing a photovoltaic element employing the above electrode.

The present invention also provides an electrode which is capable of being bonded tightly and is reliable, and is useful for photovoltaic elements and other devices without the aforementioned problems.

The present invention further provides a photovoltaic element which is free from initial power loss, occurrence of shunting, and is reliable in long-term operation without an increase of series resistance and other disadvantages.

The present invention still further provides a photovoltaic device which is produced at a reduced cost and amount of materials with simplified assembling steps and improved reliability of electric connection of electrode members and terminal members.

The present invention still further provides a process for producing the above photovoltaic device.

The photovoltaic device of the present invention comprises at least one metal wire arranged on a face of a photovoltaic element for collecting the power generated by the photovoltaic element, the metal wire being coated with an electroconductive adhesive over the entire length of the metal wire and fixed on the element with the adhesive.

The process of the present invention for producing a photovoltaic device comprising at least one metal wire arranged on a photovoltaic element for collecting electric power from the element, comprises the step of preliminarily applying the electroconductive adhesive over the entire length of the metal wire, and fixing, by the electroconductive adhesive, the metal wire to a conductor for collecting electric power from the metal wire and for outputting the power outside.

The electrode of the photovoltaic element of the present invention comprises a metal member such as a metal wire or metal bar treated for rust prevention and coated on the surface thereof with at least one electroconductive resin layer.

The photovoltaic device of the present invention comprises a photovoltaic element comprising a semiconductor junction layer and a light-transmissive upper electrode formed on the light-receiving face of the semiconductor junction, the above electrode of the photovoltaic element being fixed on the light transmissive upper electrode.

The electrode of the photovoltaic element of the present invention comprises a metal wire or metal bars treated with a coupling agent and coated with at least one electroconductive resin layer on the surface thereof.

The photovoltaic device of the present invention comprises a photovoltaic element comprising a semiconductor layer for photoelectric conversion and an electrode for collecting electric power generated by the semiconductor layer, wherein the electrode is a fine metal wire coated with at least one layer of a first electroconductive adhesive by application and drying, and is fixed on the light-receiving face of the photovoltaic element by pressing, hot-pressing, or heating; a terminal member is provided for outputting the electric power collected by the electrode on the face of the photovoltaic element; the electrode is also fixed onto the surface of the terminal member; and the terminal member is preliminarily coated with a second electroconductive adhesive at least on the electrode fixation portion.

The process for producing the photovoltaic device of the present invention comprising a photovoltaic element comprising a semiconductor layer for photoelectric conversion and an electrode for collecting electric power generated by the semiconductor layer comprises the steps of applying on a metal wire at least one layer of a first electroconductive adhesive and drying the metal wire; fixing the metal wire as the electrode on the light-receiving face of the photovoltaic element by pressing, hot-pressing, or heating; fixing the metal wire to a terminal member for outputting the electric power collected by the electrode on the face of the photovoltaic element; and preliminarily applying a second electroconductive adhesive to the terminal member at least on the electrode fixation portion.

The process for producing the photovoltaic device comprising a photovoltaic element of the present invention comprises placing, on a photovoltaic element, a collecting electrode being constituted of a metal wire coated with at least one layer of an electroconductive adhesive, and heating the photovoltaic element from the opposite face with simultaneous pressure application.

BRIEF DESCRIPTION OF THE DRAWINGS

FIG. 5 is a graph showing the deterioration of a photovoltaic element module of a Comparative Example.

FIG. 22A and 22B are schematic sectional views of a collecting electrode of a photovoltaic element formed according to the method of the present invention and the method of prior art, respectively.

FIG. 23 is a schematic sectional view of a photovoltaic element formed according to the method of the present invention.

DESCRIPTION OF THE PREFERRED EMBODIMENTS

Figure 1A:
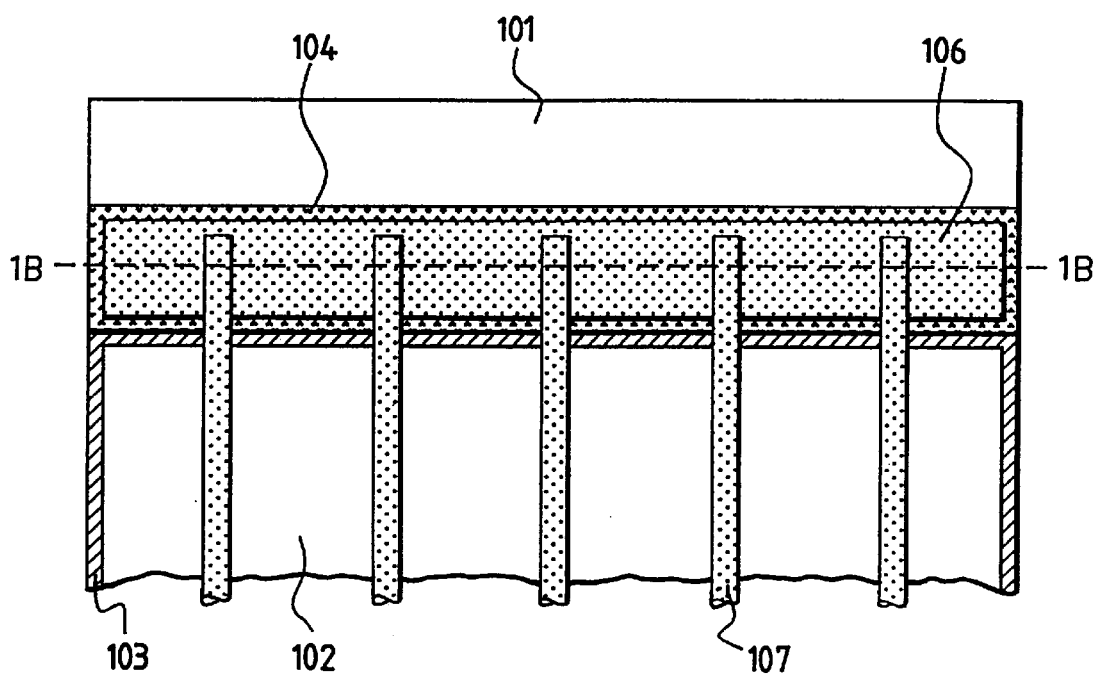
FIGS. 1A and 1B illustrate schematically the structure of the electrode of Example 1—1.

The photovoltaic device of the present invention comprises a metal wire arranged on a photovoltaic element for collecting the power generated by the photovoltaic element, the metal wire being fixed with an electroconductive adhesive applied over the entire length of the metal wire.

The metal wire employed for collecting the generated power in the present invention is preliminarily coated was on the surface with an electroconductive adhesive over the entire length thereof. On curing the electroconductive adhesive on the metal wire arranged on the electrode formation face, a lead-out conductor can be simultaneously fixed by the aforementioned electroconductive adhesive. Consequently, the step of application of an electroconductive adhesive in spots and the step of curing the adhesive which are conventionally necessary for connection between the lead-out electrode and the collecting electrodes may be omitted, thereby shortening significantly the time for working.

The element production steps are greatly simplified since the steps including the fixation of the collecting electrodes, by comparison, and the lead-out electrodes are completed in the present invention within the time of fixation of the collecting electrodes (printing and curing of an electroconductive paste) in the conventional process.

The electrode of the photovoltaic element of the present invention comprises a metal member such as a metal wire or a metal bar treated for rust prevention and coated on the surface thereof with at least one electroconductive resin layer.

The photovoltaic device of the present invention comprises a photovoltaic element comprising at least a semiconductor junction layer and a light-transmissive upper electrode formed on the light-receiving face of the semiconductor junction layer, the above electrode of the photovoltaic element being fixed on the light transmissive upper electrode. The fixation of the electrode of the photovoltaic element is made through the electroconductive resin.

The metal member is preferably made of copper or a copper alloy. The member is preferably protected from rusting by a rust-preventing agent of an imidazole type, a triazole type, or a mercaptan type. The electroconductive resin layer has a specific resistance preferably ranging from 0.1 to 100 $\Omega$cm.

The electrode of the present invention has been found after experiments to obtain satisfactory adhesion and satisfactory electroconductivity, and is characterized by the rust-preventing treatment and electroconductive resin coating of a metal wire or bar.

The excellent properties of the electrode of the present invention are considered to be obtained for the reasons given below. Copper wires, aluminum wires, and the like having low resistance and generally used for electric apparatuses are inexpensive, suitable materials for conductors. However, the surface thereof is oxidized under environmental conditions (corrosive material in the air, and humidity), especially under severe temperature-humidity cycles, deteriorating the adhesiveness and electric contact between the metal and the electroconductive resin layer. The methods for oxidation prevention of a metal include organic material coating, chemical treatment, alloy formation, electric protection, metal plating, and so forth. However, a metal surface treatment with a rust-preventing agent protects the metal surface against oxidation without change of the electrical properties of the metal surface without complicated processing steps, and yet gives high adhesion between the metal and the electroconductive resin layer.

The electrode of the photovoltaic element of the present invention comprises a metal wire or a metal bar treated with a coupling agent and coated with at least one electroconductive resin layer on the surface thereof.

The metal member is preferably made of copper or a copper alloy, and the coupling agent is preferably selected from silane type coupling agents, titanate type coupling agents, and aluminum type coupling agents. The electroconductive resin layer has a specific resistance ranging preferably from 0.1 to 100 $\Omega$cm.

The electrode of the present invention has been found after experiments to obtain satisfactory adhesion and satisfactory electroconductivity of a metal wire or a metal bar with an electroconductive adhesive, and is characterized by the coupling-agent treatment and electroconductive resin coating of the metal wire or the metal bar.

The excellent properties of the electrode of the present invention are considered to be obtained for the reasons given below. Copper wires, aluminum wires, and the like are inexpensive, suitable materials for conductors. Enameled wires are metal wires coated with an insulating paint. However, the metal substance, which is inorganic, cannot readily be coated with a material containing an organic substance. The electrode of the present invention is a metal substance, which is inorganic, coated with an electroconductive resin layer composed of an organic substance. In such a constitution, uniform coating with high adhesion is generally not readily achievable. Therefore in the present invention, the inorganic metallic substance is treated with a coupling agent, whereby the surface of the metal substance is modified for bonding with an organic substance to give high adhesion between the metal surface and the organic substance, especially under severe temperature-humidity cycle conditions, with high reliability of the electrode.

The photovoltaic device of the present invention comprises a photovoltaic element comprising a semiconductor layer for photoelectric conversion and an electrode for collecting electric power generated by the semiconductor layer, wherein the electrode is a fine metal wire coated with at least one layer of a first electroconductive adhesive by application and drying, and is fixed on the light-receiving face of the photovoltaic element by pressing, hot-pressing, or heating; a terminal member is provided for outputting the electric power collected by the electrode on the face of the photovoltaic element; the electrode is also fixed onto the surface of the terminal member; and the terminal member is preliminarily coated with a second electroconductive adhesive at least on the electrode fixation portion. Thereby, the four items below are realized.

(1) The step of application of an electroconductive adhesive after the electrode formation can be omitted, whereby the production cost can be reduced significantly. Although the electroconductive adhesive must be applied onto the terminal member in a separate process, the application of the adhesive can be conducted collectively on a plurality of elements for the terminal member without necessity of conducting the application on individual elements, whereby the working steps are greatly decreased. Furthermore, since the connection is conducted by hot-pressing, the subsequent heat-treating step is omissible.

(2) According to the above method, the amount of the electroconductive adhesive can be reduced since a thin film of the electroconductive adhesive serves efficiently.

(3) The surface coating material can be made thin since the electroconductive adhesive applied on the aforementioned terminal member does not protrude higher than the aforementioned electrodes.

(4) According to the above method, an electroconductive adhesive containing a less corrosive metal like silver may be used for connection similarly to the prior art shown in the Comparative Examples, whereby reliability is ensured for a long term. Simultaneously, the electroconductive adhesive protects the entire surface of the terminal member formed from oxidizable metal like copper, whereby oxidation of the terminal member during heat treatment in the production process and adverse effect of oxidation after the production are prevented with high reliability.

The process for producing the photovoltaic device of the present invention comprising a photovoltaic member comprising a semiconductor layer for photoelectric conversion and an electrode for collecting electric power generated by the semiconductor layer comprises the steps of applying on a metal wire at least one layer of a first electroconductive adhesive and drying the metal wire; fixing the metal wire as the electrode on the light-receiving face of the photovoltaic element by pressing, hot-pressing, or heating; fixing the metal wire also to a terminal member for outputting the electric power collected by the electrode on the face of the photovoltaic element; and preliminarily applying a second electroconductive adhesive to the terminal member at least on the electrode fixation portion. Thereby, the two items below are realized.

(1) The application of the electroconductive adhesive onto the terminal member can be conducted separately from the electrode-forming process. Thereby, the working efficiency per unit time can be improved and production can be carried out at a lower cost.

(2) According to the above method, the individual electrodes are simultaneously fixed onto the surface of the light-receiving face of the photovoltaic element. Thereby, the fixation of the contact points is made uniform and reliable, and the assembling steps are simplified to lower the production cost.

As described above, the present invention simplifies the production process and the production apparatus of the photovoltaic element, and reduces the materials such as the photovoltaic element and the surface coating material. Thereby the production cost is reduced, and reliability of the photovoltaic element is improved over a long term.

The process for producing the collecting electrode for the photovoltaic element of the present invention comprises placing, on a photovoltaic element, a collecting electrode constituted of a metal wire coated with at least one layer of an electroconductive adhesive, and heating the photovoltaic element from the opposite face with simultaneous pressure application.

The temperature of the above heating is preferably in the range of from the softening temperature to a temperature higher than that by 150° C. The applied pressure is preferably in the range of from 1 to 10 kg/cm$^2$.

Comprehensive Investigation was made by the inventors of the present invention in order to mass produce photovoltaic elements in a high yield. Consequently, a method of fixing a coated wire on a light-receiving face of a photovoltaic element has been found in which the metal wire is coated with an electroconductive adhesive in a dry state; the coated metal wire is placed on a light-receiving face of the photovoltaic element; the electroconductive adhesive is softened by heating from the opposite face of the element with simultaneous application of pressure through a soft resin.

In the method of the present invention, only the necessary portions of the electroconductive adhesive coating the metal wire are softened without undesirable spreading of the electroconductive adhesive and the adhesion is made uniform by application of the pressure to the coated wire by use of a soft resin. The temperature of heating the electroconductive adhesive is preferably in the range of from the softening point thereof to a temperature higher than that by 150° C., whereby the spreading of the adhesive is less and low shadow loss and high performance of the photovoltaic element is obtainable. The applied pressure is preferably in the range of from 1 to 10 kg/cm$^2$, whereby the spreading of the electroconductive adhesive is prevented and the adhesion is stable and uniform with high adhesion strength.

The present invention is described below in more detail with reference to the Examples.

Metal Wire 107

The metal wire 107 employed in the present invention, which is used for passing electric current, is preferably made of a metallic material having a low volume resistivity to minimize the ohmic loss. The metallic material is exemplified by gold, silver, copper, nickel, aluminum, and alloys thereof. The cross-section may be circular or square or other shape, and is selected as desired. The thickness of the metal wire is selected to minimize the sum of the ohmic loss and the shadow loss. The metal wire is exemplified by a copper wire for enamel wires having diameter of 25 to 200 $\mu$m for obtaining an effective solar cell.

Conductor 106

The conductor 106 for the lead-out electrode may be made of gold, silver, copper, lead, nickel, and alloys thereof, similarly to the above metal wire, but is not limited thereto, and may be a plated metal such as silver-plated copper, and solder-plated copper. The shape is not specially limited, and may be in a form of a wire or a foil.

Electroconductive Adhesive

The electroconductive adhesive needs to have a negligible specific resistance for collecting the power generated by the solar cell, and is appropriate not to cause shunting. The specific resistance thereof ranges preferably from 0.1 to 100 $\Omega$cm. With a specific resistance of 0.1 $\Omega$cm or lower, shunting is liable to occur, while with a specific resistance of 100 $\Omega$cm or higher, the ohmic loss is larger. The electroconductive adhesive having the above preferred specific resistance is obtained by dispersing electroconductive particles in a high polymer resin. The material for the electroconductive particles includes graphite, carbon black, $In_2O_3$, $TiO_2$, $SnO_2$, ITO, ZnO, and oxide semiconductor materials prepared by adding a suitable dopant to the above materials.

The electroconductive adhesive is further required to adhere the metal wire to the electrode-forming face of the solar cell and the lead-out conductor. The electroconductive adhesive is still further required to protect the metal wire against external moisture and to be resistant to migration of metal ions from the metal. Because of these reasons, a resin is suitable which exhibits strong adhesion and less moisture permeability. The resin therefor includes thermosetting resins such as epoxy resins, urethane resins, butyral resins, fluoroplastic resins, and modified resins thereof; and thermoplastic resins such as acrylic resins and styrene resins.

The electroconductive adhesive is prepared by mixing the aforementioned electroconductive particulate material and the aforementioned polymer resin in an appropriate ratio. With a higher ratio of the electroconductive particulate material, although the specific resistance is lower, the adhesion is lower because of the lesser amount of the resin. To the contrary, with a higher ratio of the resin, although the adhesion is high, the specific resistance becomes disadvantageously higher because of insufficient contact of electroconductive particles. Accordingly, the ratio of the electroconductive particulate material to the polymer resin is suitably selected depending on the properties of the respective materials.

Specifically the electroconductive particulate material is employed at a content of from 5% to 95% by volume to obtain a suitable specific resistance and a suitable adhesion. The mixing is carried out by a typical dispersion method such as a three-roll mill and a paint shaker. For facilitating the dispersion, a dispersing agent or a coupling agent may be added as desired. The typical dispersion may be diluted with a suitable solvent during or after the dispersing operation to adjust the viscosity of the electroconductive adhesive.

The electroconductive adhesive may be suitably applied by a film-forming coating method for an enamel wire. For example, a metal wire coated with an electroconductive adhesive is prepared by diluting the electroconductive adhesive with a solvent to obtain a suitable viscosity; applying the diluted adhesive on the metal wire by means of a roll coater or the like to form a coating film thereon; passing the coated wire through a die to obtain a desired coating film thickness; and drying the adhesive by infrared heating or a like method.

The metal wire coated with an electroconductive adhesive is usually bonded to the electrode formation face of the solar cell and the lead-out conductor as follows. When the adhesive is a hot-melt resin type, the adhesion is achieved by softening the adhesive, usually by heating and optionally with application of pressure. When the adhesive is a thermosetting resin type, a coating film is formed and dried without causing curing reaction, and is cured by heating at the time of adhesion.

Photovoltaic Element

Figure 2:
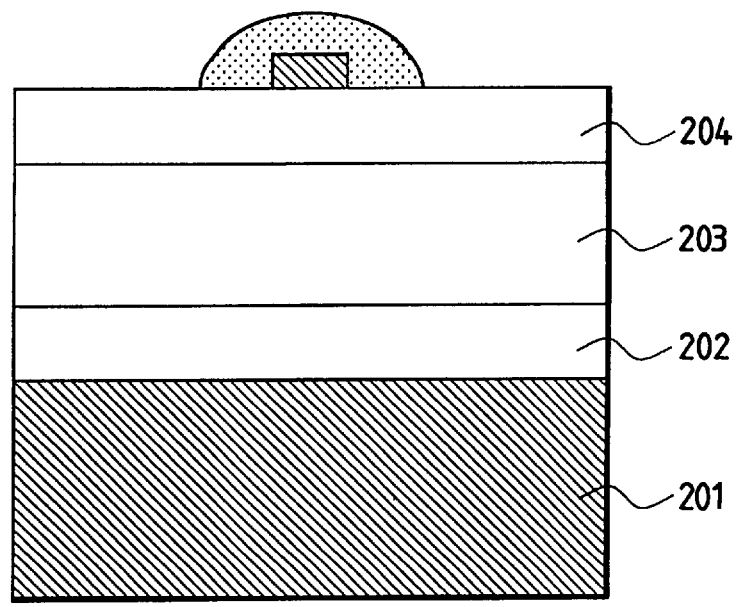
FIG. 2 illustrates schematically the photovoltaic element of Example 1—1.

The photovoltaic element (FIG. 2) of the present invention is preferably useful for amorphous silicon type solar cells which are desired to be flexible. It is also useful for other types of solar cells such as monocrystalline silicon, polycrystalline silicon, non-silicon, and Schottky banier type solar cells.

Substrate 201

The substrate 201, in a thin-film solar cell such as amorphous silicon type cells, mechanically supports a semiconductor layer and may be used as the electrode. Therefore, the substrate 201 may be electroconductive or electrically insulating, while it is required to have heat resistance to the heating temperature during formation of a semiconductor layer 203.

Electroconductive materials for the substrate includes specifically thin sheets and composites of metals such as Fe, Ni, Cr, Al, Mo, Au, Nb, Ta, V, Ti, Pt, and Pb, and alloys of the metals such as brass, stainless steel, and the like; carbon sheets; and zinc-plated steel plates. Electrical insulating materials for the substrate include films and sheets of synthetic resins such as polyester resins, polyethylene resins, polycarbonate resins, cellulose acetate resins, polypropylene resins, polyvinyl chloride resins, polyvinylidene resins, polystyrene resins, polyamide resins, polyimide resins, and epoxy resins having heat resistance; composites of the above resins with glass fibers, carbon fibers, boron fibers, and metal fibers; the above metal thin plates and the above resin plates covered with surface coating of a metal and/or an insulating material such as $SiO_2$, $Si_3N_4$, $Al_2O_3$, and AlN formed by sputtering, vapor deposition, metal plating, or like methods; glass and ceramics; and the like.

Lower Electrode 202

The lower electrode 202 is for outputting the electric power generated by the semiconductor layer, and is required to have a work function which gives an ohmic contact with the semiconductor layer. The materials therefor include simple metals, alloys, and light-transmissive electroconductive oxides (TCO) such as Al, Ag, Pt, Au, Ni, Ti, Mo, Fe, V, Cr, Cu, stainless steel, brass, nichrome, $SnO_2$, $In_2O_3$, ZnO, and ITO. The surface of the lower electrode 202 is desirably smooth. When irregular reflection is desired, the surface may be made rough by texture treatment. In the case where the substrate 201 is electroconductive, the lower electrode 202 is not particularly necessary.

The lower electrode is prepared, for example, by metal plating, vapor deposition, or sputtering.

Semiconductor Layer 203

The semiconductor layer 203 may be any known semiconductor generally used for thin film solar cells. The semiconductor layer of the solar cell element of the present invention includes pin-junction non-crystalline silicon layers (the noncrystalline layers herein including microcrystalline layers), pn-junction polycrystalline silicon layers, and compound semiconductor layers such as $CuInSe_2/CdS$. The non-crystalline silicon layer can be prepared by plasma CVD using a starting material gas for thin film formation such as silane, and conductivity-controlling phosphine or diborane gas. The pn-junction polycrystalline silicon layer can be formed by thin film formation from molten silicon. The $CuInSe_2/CdS$ semiconductor layer can be formed by electron beam vapor deposition, sputtering, electrodeposition, or like method.

Upper Electrode 204

The upper electrode 204 serves as an electrode to output the electromotive force generated in the semiconductor layer, and is counter to the lower electrode 202. The upper electrode 204 is indispensable for a semiconductor having a high sheet resistance such as amorphous silicon, but is not indispensable for a crystalline type of solar cell having a low sheet resistance. The upper electrode 204 needs to be transmissive at least to light which is to be absorbed by the semiconductor, and is sometimes called a transparent electrode. The upper electrode 204 preferably has light transmittance of 85% or higher for effective absorption of light from the sun or a white fluorescent lamp, and sheet resistance of not higher than 100 $\Omega/cm^2$ to allow the generated electric current to flow in a lateral direction of the semiconductor layer. The materials having such properties include metal oxides such as $SnO_2$, $In_2O_3$, ZnO, CdO, $CdSnO_4$, and ITO ($In_2O_3+SnO_2$).

Metal Wires

Examples 2-1 to 2-8, and Examples 3-1 to 3-8 are similar to Examples 1-1 to 1-3.

The material for the metal member includes electroconductive materials such as copper, copper alloys, and gold: copper and copper alloys are suitably used because of their low cost. The cross-section may be selected as desired, and may be circular or rectangular. For example, metal wires such as a copper wire having a diameter ranging from 25 $\mu$m to 1 mm for enamel wires as defined in JIS C3202 are suitably used. Such metal wires are formed by a wire drawing machine into a desired diameter. The metal wire having passed through the metal drawing machine is rigid, and may be annealed to obtain the desired ductility and flexibility.

The diameter of the metal wire is selected to minimize the sum of the shadow loss and the ohmic loss, and is preferably in the range of from 25 to 300 $\mu$m. The wire pitch is optimized to be narrow for a small wire diameter and to be wide for a large wire diameter to maximize the efficiency.

Rust-Preventing Agent

The rust-preventing agent employed in the present invention includes imidazole type compounds, triazole type compounds, and mercaptan type compounds. The rust-preventing agent in the present invention differs from generally used rust-preventing paints and rust-preventing oil which form a resin coating film or an oil film to protect metal surface from the outside, but forms a chemical conversion coating on contact with the surface of the copper or the copper alloy. The formed chemical conversion coating is composed of a chelate compound, which retards oxidation of the surface of the copper, and improves the adhesion without changing the electrical properties of the treated surface. The rust-preventing agent may be employed as a mixture with an acid, water, or an organic solvent. Two or more kinds of rust-preventing agents may be used in combination. The formed chemical conversion coating is a tough film, exhibiting a long-term rust-prevention effect.

The electroconductive resin layer formed in contact with the metal wire performs the functions of protecting the metal from moisture, resisting migration of metal ions, fixing the metal wire to the solar cell, and collecting the generated electric power. The electroconductive resin layer is formed by mixing and dispersing a high polymer resin and a fine particulate electroconductive material to form an electroconductive paint, applying the paint on the metal wire, and drying or heat-curing the paint. In order to obtain the above functions, the polymer resin may be thermosetting or thermoplastic, and is preferably less moisture-permeable. Specific examples of the polymer resin include epoxy resins, urethane resins, butyral resins, phenol resins, melamine resins, alkyd resins, polyester resins, polyimide resins, and fluoroplastic resins. A curing agent may be added to the polymer resin for curing the electroconductive resin layer.

Coupling Agent

The coupling agents preferably employed in the present invention include silane type coupling agents, titanate type coupling agents, and aluminum type coupling agents. The coupling agent has a hydrophilic moiety which interacts with inorganic substances and an organic functional moiety which interacts with organic substances. The coupling agent is used mainly for controlling the interface between the different substances, and differs from usual surfactants in that the function is based on formation of covalent bonding. The coupling agent serves as intermediate between an inorganic substance (metal) and an organic substance (high polymer resin in the electroconductive resin) to bond them strongly.

The silane type coupling agent is linked by covalent bonding both to the inorganic substance and to the organic substance. On the other hand, the titanate type coupling agent and the aluminum type coupling agent do not form a covalent bond with the organic substance. However, by changing the surface polarity and the surface energy of the inorganic substance, the bonding strength to the organic substance can be increased. To obtain the most suitable properties, the coupling agent is reacted with the metal surface in an optimum amount, and the amount of the coupling agent is usually adjusted by diluting the coupling agent with a solvent. The solvent includes methanol, ethanol, isopropyl alcohol, toluene, benzene, acetone, methylcellosolve, tetrahydrofuran, water, and the like. A solvent is used which is compatible with the coupling agent. Since at a higher concentration, the coupling agent is inactivated, the coupling agent is usually used at a lower concentration, preferably in the range of from 0.1% to 5.0%. The suitability of the hydrolyzable group of the coupling agent of the silane type, the titanate type, or the aluminum type to the inorganic substance needs to be considered. The organic functional group of the coupling agent includes groups of amino, epoxy, carboxyl, and phosphite, and the suitability of these groups to the organic compound needs to be considered.

The treatment of the metal wire with the coupling agent may be conducted by spraying, dipping, roll-coating as conducted for enamel wire coating, and like methods. A simple method preferably employed is coating by passing the metal wire through a felt or like material containing a coupling agent. For effective treatment with the coupling agent, the surface of the metal wire is preferably cleaned preliminarily to remove any oily matter or staining by treatment with a cleaning solvent such as acetone, methyl ethyl ketone, and isopropyl alcohol. These solvents are preferred because they do not remain on the metal surface due to their high volatility. After the coupling agent treatment, the metal wire is dried under prescribed conditions to evaporate off the solvent and simultaneously to accelerate the reaction of the coupling agent with the metal. The drying conditions are selected depending on the coupling agent and the metal.

The electroconductive resin layer formed in contact with the metal wire performs the functions of protecting the metal from moisture, resisting migration of metal ions, fixing the metal wire to the solar cell, and collecting the generated electric power. The electroconductive resin layer is formed by mixing and dispersing a high polymer resin and a fine particulate electroconductive matter to form an electroconductive paint, applying the paint on the metal wire, and drying or heat-curing the paint. In order to obtain the above functions, the polymer resin may be thermosetting or thermoplastic, and is preferably less moisture-permeable.

Specifically, the polymer resin includes epoxy resins, urethane resins, butyral resins, phenol resins, melamine resins, alkyd resins, polyester resins, polyimide resins, and fluoroplastic resins. A curing agent may be added to the polymer resin for curing the electroconductive resin layer. The adhesion of the electroconductive resin with the metal is improved by selecting a suitable coupling agent.

In any of the embodiments employing a rust-preventing agent and/or a coupling agent, the electroconductive adhesive is required to have a specific resistance which is negligible in collecting the electric power generated by the solar cell and does not cause shunting. The specific resistance thereof preferably ranges from 0.1 to 100 $\Omega$cm. The electroconductive adhesive having the above preferred specific resistance is obtained by dispersing electroconductive particles in a high polymer resin. The materials for the electroconductive particles include carbon black, graphite, $In_2O_3$, $TiO_2$, $Sno_2$, ITO, ZnO, and oxide semiconductor materials prepared by adding a suitable dopant to the above materials. The electroconductive particles are required to have a diameter smaller than the thickness of the electroconductive coating layer to be formed. However, with an excessively small diameter, the resistance at the contact point of the particles is too large to give the desired low specific resistance. Therefore, the particle diameter of the electroconductive particles is preferably in the range of from 0.02 to 15 $\mu$m.

The electroconductive particulate material and the polymer resin are mixed in an appropriate ratio. With a higher ratio of the electroconductive particulate material, although the specific resistance is lower, the stability of the coating film is lower because of the lesser amount of the resin. Accordingly, the ratio of the electroconductive particulate material to the polymer resin is suitably selected depending on the properties of the respective materials. Specifically, the electroconductive particulate material is employed at a content of from 5% to 95% by volume to obtain a suitable specific resistance. The two materials are mixed by a standard dispersion method such as a three-roll mill and a paint shaker. The dispersion may be diluted with a suitable solvent during or after the dispersing operation to adjust the viscosity of the electroconductive adhesive.

The thickness of the electroconductive resin layer is selected depending on the diameter of the metal wire and the intended properties. When the diameter of the metal wire is 100 $\mu$m, the thickness is preferably in the range of from 1 to 30 $\mu$m in order to avoid pinhole formation, to obtain the sufficient function of a barrier layer, and to avoid significant shadow loss.

The electroconductive resin layer is preferably made of a hot-melt type resin to be bonded to the solar cell by softening by heating. An appropriate pressure may be applied during the bonding. When the electroconductive layer is thermoplastic, the layer becomes softened by heating. When the electroconductive layer is thermosetting, the solvent may be removed by drying when coating the metal wire without curing, and the electroconductive layer may be cured at the time of bonding.

Figure 6:
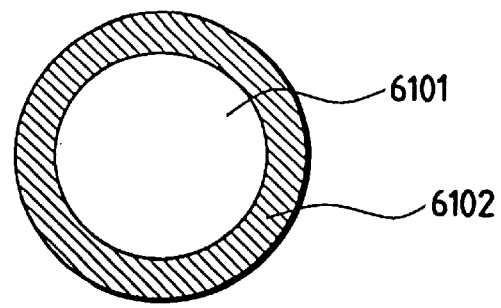
FIG. 6 is a schematic sectional view showing the constitution of a metal wire coated with an electroconductive resin.
Figure 7:
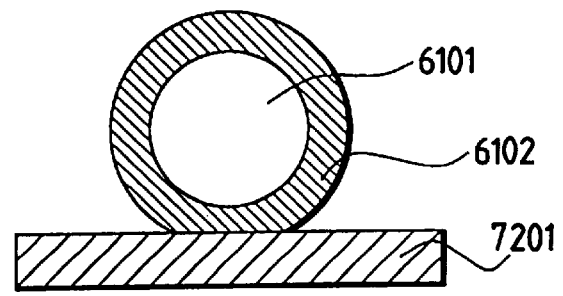
FIG. 7 is a schematic sectional view of an electrode fixed on an upper electrode of the photovoltaic element of the present invention.

FIG. 6 shows a cross-section of a metal wire electrode coated with an electroconductive resin. FIG. 7 shows a cross-section of a part of a photovoltaic element in which an electrode is fixed on an upper electrode by an electroconductive resin. In FIGS. 6 and 7, the metal wire 6101 is coated with an electroconductive resin layer 6102. In FIG. 7, the numeral 7201 indicates a main body of a photovoltaic element having a laminated upper electrode. The electroconductive resin layer 6102 is preferably formed on the wire 6101 concentrically therewith.

The electroconductive resin may be applied by dipping. However, it is suitably applied by a standard enamel wire coating method. Specifically, the electroconductive paint is diluted to obtain an appropriate viscosity; the diluted paint is applied onto the metal wire by a roll coater or the like; the metal wire is allowed to pass through a die to obtain a desired film thickness; and then the wire is heated by infrared heating or a like method to dry and cure the paint.

Figure 8:
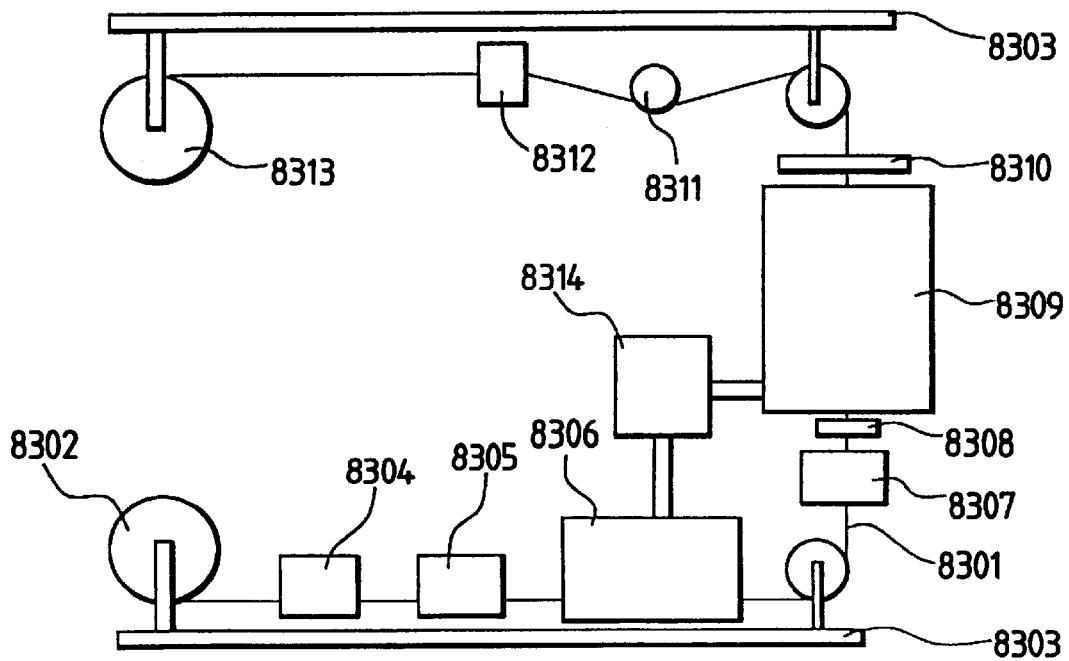
FIG. 8 illustrates schematically an apparatus for coating an metal wire with an electroconductive resin.

FIG. 8 illustrates schematically a specific example of an apparatus for coating a metal wire with an electroconductive resin. The wire may be delivered either vertically or horizontally. In FIG. 8, the numeral 8301 indicates a metal wire: 8302 a supply reel; 8303 stretching devices; 8304 a cleaning vessel; 8305 a vessel for rust-prevention treatment and/or coupling agent treatment; 8306 a drying furnace; 8307 a coater; 8308 a die; 8309 a curing-drying furnace; 8310 a thickness tester; 8311 a tension controller; 8312 a wind-up driving device; 8313 a take-up reel; and 8314 a temperature controller. The supply reel 8302 is a bobbin having uncoated metal wire wound thereon. Tension is applied to the metal wire throughout the coating apparatus by the stretching devices 8303 to keep the wire taut. The cleaning vessel 8304 is an optionally employed vessel filled with a solvent such as acetone, methyl ethyl ketone, and isopropyl alcohol, serving to clean the surface of the metal wire 8301. The vessel 8305 contains a rust-preventing agent and/or a coupling agent and treats the metal wire 8301 for rust prevention and/or coupling. The drying furnace 8306 is an air drier or an infrared drier for drying the rust-preventing agent and/or the coupling agent applied on the metal wire.

The coater 8307 is a device for applying the electroconductive paint onto the metal wire 8301. The coater stores the electroconductive paint, and may further be provided with a solvent-supplying mechanism for viscosity adjustment, a temperature-controlling mechanism, an electroconductive paint-replenishing mechanism, filtering mechanism, and the like. The die 8308 controls the thickness of the applied electroconductive paint. A commercial die for enamel coating is suitably used as the die 8308. If desired, felt may be employed. The curing-drying furnace 8309 removes the solvent from the electroconductive paint to dry it, or cures the paint, and may be an air drier or an infrared dryer. The thickness tester 8310 measures and controls the thickness of the applied electroconductive paint, and a commercial outer-diameter tester is suitable for it. The wire delivery rate, or paint viscosity may be controlled by feeding back the film thickness measured by the thickness tester 8310.

The tension controller 8311 applies tension constantly to the metal wire to cause neither loosening nor yielding of the wire. The wind-up driving device 8312 winds up the metal wire with a controlled spacing between the wire to the take-up reel 8313. The take-up reel 8313 is rotated to keep the prescribed transport rate by a motor not shown in the drawing.

The temperature controller 8314 controls the temperatures of the drying furnace 8306 and the curing-drying furnace 8309 as prescribed by a conventional control method such as voltage control, on-off control, and PID control.

The apparatus in FIG. 8 is of a vertical type. The delivery direction of the metal wire may be either vertical or horizontal. The apparatus of FIG. 8 conducts single wire coating, but two or more wires may be simultaneously treated for coating.

The electroconductive resin layer may be constituted of a plurality of layers, and the functions of power collection, shunting prevention, migration prevention, electrode fixation, etc. may be assigned to the respective layers. Two or more layer coating may be conducted with bobbin wind-up for every coating step, or with successive formation of a plurality of coating layers and final bobbin wind-up.

Figure 9:
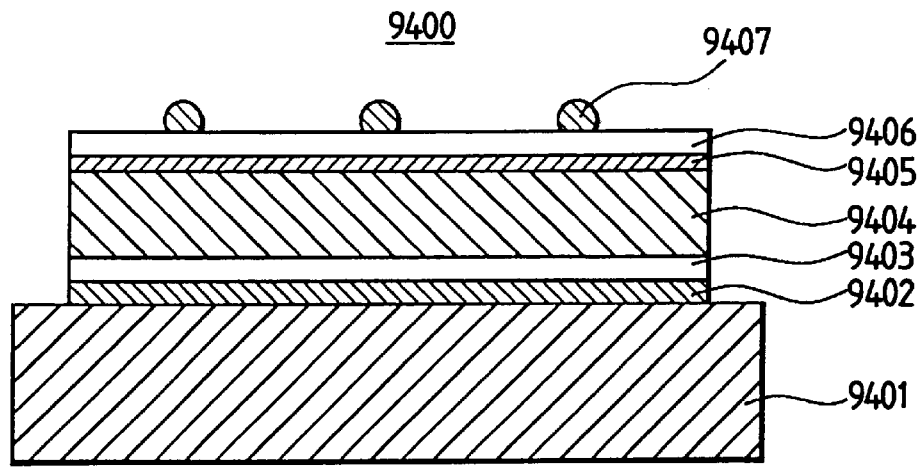
FIG. 9 illustrates schematically the constitution of a photovoltaic element of the present invention.

The photovoltaic element of the present invention is explained by reference to FIG. 9. In FIG. 9, the numeral 9401 is a supporting substrate; 9402 a lower electrode; 9403, 9404, and 9405 respectively a semiconductor layer; 9406 an upper electrode; and 9407 an electrode (grid electrode) of the present invention.

The grid electrode 9407 is constituted of a metal wire 6101 and an electroconductive resin layer 6102 (FIGS. 6–7 ) The electroconductive resin layer 6102 needs to have a resistance which does not impair the efficiency of the photovoltaic element but is sufficiently high to prevent shunting. Thereby, the resin layer is not a resistance to the electric current generated by the solar cell but serves as a resistance to defects so as to prevent significant leakage. The specific resistance of the electroconductive resin layer 6102 is selected in consideration of the design of the grid, the current intensity at the operating point of the photovoltaic element, and is preferably in the range of from 0.1 to 100 Ωcm. Within this range, the resistance is sufficient to offset possible shunting and is negligible to the electric current generated by the photovoltaic element.

The grid electrode 9407 is placed on the light-receiving face side of the photovoltaic element 9400, preferably in parallel at an appropriate spacing. The grid of the present invention is particularly suitable for a large-area solar cell. For example, to prepare a solar cell of 30 cm square, grid electrodes of 30 cm long are placed in parallel at a prescribed spacing. The grid electrode of the present invention, which has the property of minimizing electric leakage caused by shunting, is useful not only for amorphous silicon type solar cells but also for photovoltaic elements having a semiconductor junction such as a pn junction, pin junction, and Schottky junction. The same structure is naturally applicable also to solar cells employing a semiconductor of monocrystalline type, polycrystalline type, non-silicon type, or Schottky junction type.

Embodiments of the photovoltaic element of the present invention are explained by reference to FIGS. 9 to 11.

FIG. 9 illustrates schematically amorphous silicon type solar cell having a single cell structure, and receiving light on the face opposite to the substrate. FIG. 10 illustrates schematically an amorphous silicon type solar cell of triple junction structure construction. FIG. 11 is a plan view of the solar cell of FIG. 9 and FIG. 10 viewed from the light-introducing face side, having grid electrodes of about 30 cm long.

Although not shown in the drawing, the structure based on the idea of the present invention is naturally applicable also to amorphous silicon, monocrystalline, and thin film polycrystalline solar cells formed on a light-transmissive insulating substrate.

The substrate 9401 is a member for mechanically supporting the semiconductor layers 9403, 9404, 9405 (thin films of amorphous silicon), and in some cases, it is used as an electrode. The substrate 9401 needs to be heat-resistant at the heating temperature for forming the films of the semiconductor layers 9403, 9404, 9405, but may be either electroconductive or insulating. The electroconductive materials include thin sheets and composites of metals such as Fe, Ni, Cr, Al, Mo, Au, Nb, Ta, V, Ti, Pt, Pb, and Ti; alloys of metals such as brass, stainless steel; carbon sheets; galvanized sheet iron; and the like. The electrically insulating materials include films or sheets of heat-resistant synthetic resins such as polyesters, polyethylenes, polycarbonates, cellulose acetates, polypropylenes, polyvinyl chlorides, polyvinylidene chlorides, polystyrenes, polyamides, polyimides, and epoxy resins; composites of the above resins with fiber such as glass fiber, carbon fiber, boron fiber, and metal fiber; the above resin sheets and metal sheets surface-coated with different kinds of metal thin film and/or insulating thin films such as $SiO_2$, $Si_3N_4$, $Al_2O_3$, and AlN by sputtering, vapor deposition, metal plating, or the like; and glass and ceramics.

The lower electrode 9402 outputs the electric power generated in the semiconductor layers 9403, 9404, 9405, having a work function which provides ohmic contact with the semiconductor layer 9403. The materials therefor include simple metals, alloys, and light-transmissive electroconductive oxides (TCO) such as Al, Ag, Pt, Au, Ni, Ti, Mo, W, Fe, V, Cr, Cu, stainless steel, brass, nichrome, $SnO_2$, $In_2O_3$, and ITO. The surface of the lower electrode 9402 is desirably smooth. When irregular reflection is desired, the surface may be made rough by texture treatment. In the case where the substrate 9401 is electroconductive, the lower electrode 9402 is not particularly necessary. The lower electrode is prepared, for example, by metal plating, vapor deposition, or sputtering.

The upper electrode may be prepared by resistance-heating vapor deposition, electron beam heating vapor deposition, sputtering, spraying, or like method.

The semiconductor layer employed for the solar cell in the present invention is formed from amorphous silicon, polycrystalline silicon, monocrystalline silicon, or the like. In the amorphous silicon type solar cell, the semiconductor material constituting the i-layer 9404 includes Group IV type and Group IV alloy type amorphous semiconductors such as a-Si:H, a-Si:F, a-Si:H:F, a-SiGe:H, a-SiGe:F, a-SiGe:H:F, a-SiC:H, a-SiC:F, and a-SiC:H:F. The semiconductor material constituting the p-layer 9405 or the n-layer 9403 is obtained by doping a valence electron controlling agent into the aforementioned semiconductor material for the i-layer 9404. The valence electron controlling agent for the p-type semiconductor includes compounds having a Group III element of the Periodic Table, such as B, Al, Ga, and In. The valence electron controlling agent for the n-type semiconductor includes compounds having a Group V element of the Periodic Table, such as P, N, As, and Sb.

The amorphous silicon semiconductor layer is formed by conventionally known methods including vapor deposition, sputtering, RF plasma CVD, microwave plasma CVD, ECR, thermal CVD, and LPCVD. Industrially, RF plasma CVD is suitably applicable in which the starting material gas is decomposed by RF plasma and deposited on a substrate. The RF plasma CVD has disadvantages of low decomposition efficiency of the starting material gas of about 10% and a low deposition rate of 1 to 10 Å/sec. Microwave plasma CVD which is an improvement of the RF plasma method is also applicable without the above disadvantages. The reaction apparatus for the film formation bay be of batch type or of continuous type and may be selected from known conventional apparatuses. The solar cell may be a tandem cell in which two or more semiconductor junctions are laminated for improvement of spectral sensitivity and voltage.

The upper electrode 9406 serves as an electrode to output the electromotive force generated in the semiconductor layers 9403, 9404, 9405, and is counter to the lower electrode 9402. The upper electrode 9406 is necessary for a semiconductor having a high sheet resistance such as amorphous silicon, but is not indispensable for a crystalline type of solar cell having a low sheet resistance. The upper electrode 9406 needs to be transmissive at least to the light to be absorbed by the semiconductor, and is sometimes called a transparent electrode. The upper electrode 9406 preferably has a light transmittance of 85% or higher for effective absorption of light from the sun or a white fluorescent lamp, and a sheet resistance of not higher than 100 $\Omega/cm^2$ to allow the generated electric current to flow in a lateral direction of the semiconductor layer. The materials having such properties include metal oxides such as $SnO_2$, $In_2O_3$, ZnO, CdO, $CdSnO_4$, and ITO ($In_2O_3+SnO_2$).

Figure 11:
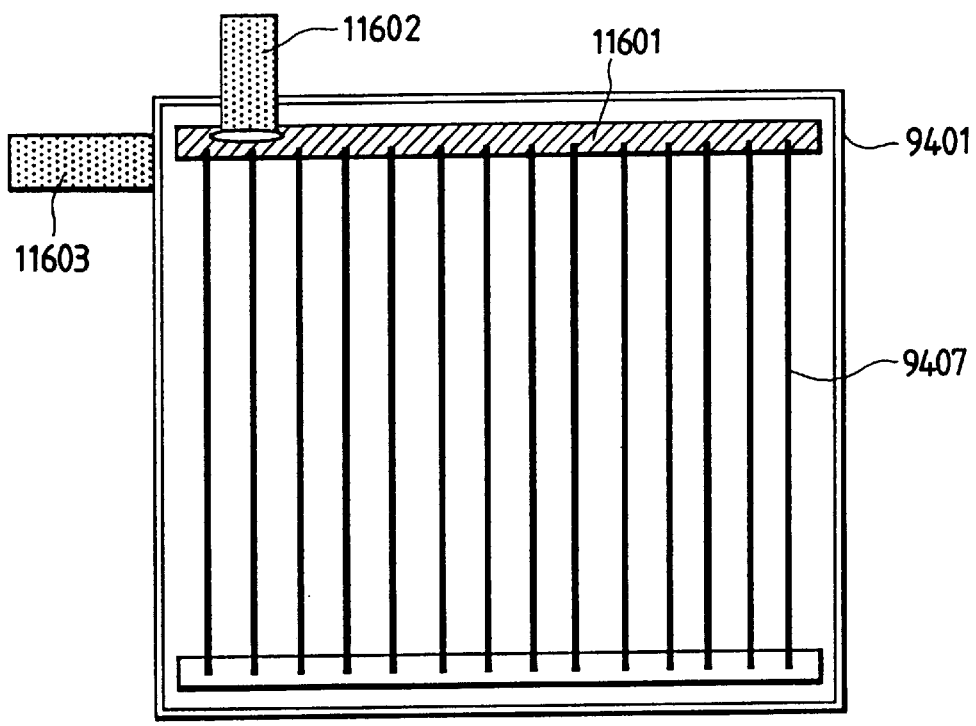
FIG. 11 is a schematic plan view showing the constitution of a solar cell of the present invention.

The tab 11601 employed in the present invention is a power-collecting part, which may be made of a metal such as Cu, Ag, and Pt, or an alloy thereof (see FIG. 11). The tab is preferably in a shape of a sheet, a tape, or a foil, and is bonded with an adhesive or the like.

The solar cell prepared as above is encapsulated by a known method to prepare a module in order to obtain weatherability and to keep mechanical strength in outdoor use. For the encapsulation, specifically, EVA (ethylene-vinyl acetate copolymer) is suitably used as an adhesive layer in view of its adhesion to the solar cell, weatherability, and cushioning effect, and a fluoroplastic resin is laminated thereto as a surface protection layer to improve moisture resistance and to mechanically protect. The useable fluoroplastic resins include tetrafluoroethylene polymer (TFE, Teflon produced by DuPont), tetrafluoroethylene-ethylene copolymer (ETFE, Tefzel produced by DuPont), polyvinyl fluoride (Tedlar produced by DuPont), and polychlorofluoroethylene (CTFE, Neoflon produced by Daikin Kogyo), To these resins, a known ultraviolet absorber may be added to improve weatherability. The encapsulation is preferably conducted by heating and pressing the resin film and the solar cell substrate in a vacuum by means of a known apparatus such as a vacuum laminator.

Examples 4-1 to 4-3 are explained below in detail.
Semiconductor Layer

Any photovoltaic material including amorphous semiconductors, crystalline semiconductors, and compound semiconductors may be used without restriction.
Terminal Member The terminal member is preferably prepared from a metal having a low volume resistivity such as copper, silver, aluminum, and nickel. Metals containing copper are preferred, because of low resistance and low cost of the terminal member and the possibility of minimizing transmission loss to obtain larger power per area.
First Electroconductive Adhesive An electroconductive adhesive containing carbon, a low-resistivity metal, a metal oxide, or the like is useful as the first electroconductive adhesive. High polymer materials containing powdered carbon are particularly preferred, because it is capable of forming ohmic connection with the photovoltaic element to realize low contact resistance with low resistance loss.
Second Electroconductive Adhesive An electroconductive adhesive containing carbon, a low-resistivity metal, a metal oxide, or the like is useful as the second electroconductive adhesive. High polymer resins containing powdered material mainly composed of silver or containing a powdered metal or alloy coated with silver are preferred, because it enables connections of low resistance with less liability of oxidative and other deterioration. When the terminal member is prepared from a copper-containing metal and the first electroconductive adhesive is a carbon-containing high polymer resin, the copper surface is liable to undergo electrochemical oxidative deterioration (anodic oxidation) at the contacting interface. However, the above oxidative deterioration of the copper surface can be prevented by use of the second electroconductive adhesive which is composed of a high polymer resin containing a powdered material mainly composed of silver or containing a powdered metal or alloy coated with silver.

Examples 5-1 to 5-3 are explained below.

In this embodiment, the metal wire is prepared from a sufficiently electroconductive material such as copper, silver, and gold. The cross-section of the metal wire may be selected as desired, and may be circular or rectangular. For example, metal wires such as a copper wire having a diameter ranging from 25 $\mu$m to 1 mm for enamel wires as defined in JIS C3202 are suitably used. Such metal wires are stretched by a wire drawing machine into a desired diameter. The metal wire having passed through the metal drawing machine is rigid, and may be annealed to be flexible to obtain the desired ductility and flexibility. The diameter of the metal wire is selected to minimize the sum of the surface shadow loss of the solar cell and the ohmic loss, and is preferably in the range of from 25 to 200 $\mu$m. The wire pitch is optimized to be narrow for a small wire diameter and to be wide for a large wire diameter to maximize the efficiency.

The electroconductive adhesive may be applied by a typical enamel wire coating method. Specifically, the electroconductive paint is diluted to obtain an appropriate viscosity; the diluted paint is applied onto the metal wire by a roll coater or the like; the metal wire is allowed to pass through a die to obtain a desired film thickness; and then the wire is heated by infrared heating or a like method to dry and cure the paint. The delivery direction of the metal wire may be either vertical or horizontal. Two or more electroconductive adhesive layer coatings may be conducted with bobbin wind-up for every coating step, or with successive formation of a plurality of coating layers and final bobbin wind-up. The metal wire coated with the electroconductive adhesive is stored in the wound-up state and is unwound on formation of the grid of the solar cell.

A suitable solar cell for the above-described electrode preferably comprises a semiconductor layer for power generation, a light-transmissive electroconductive layer provided on the light-receiving face of the semiconductor layer, a first electrode as described above of the present invention provided on the light-transmissive electroconductive layer, and a second electrode provided on the face of the semiconductor layer opposite to the light-receiving face. The aforementioned semiconductor layer has a structure of semiconductor junction such as a pn-junction, pin-junction, and Schottky junction. The material therefor includes Group IV semiconductors such as crystalline silicon, polycrystalline silicon, and amorphous silicon; Group II-VI compound semiconductor such as CdS, and CdTe; and Group III-V compound semiconductor such as GaAs.

The first electrodes, the electrodes of the present invention, are placed on the light-receiving face of the semiconductor layer, preferably in parallel at an appropriate spacing. The electrode of the present invention is particularly suitable for a large-area solar cell. For example, in a solar cell of 30 cm square, grid electrodes of 30 cm long are placed in parallel at a prescribed spacing.

Figure 18:
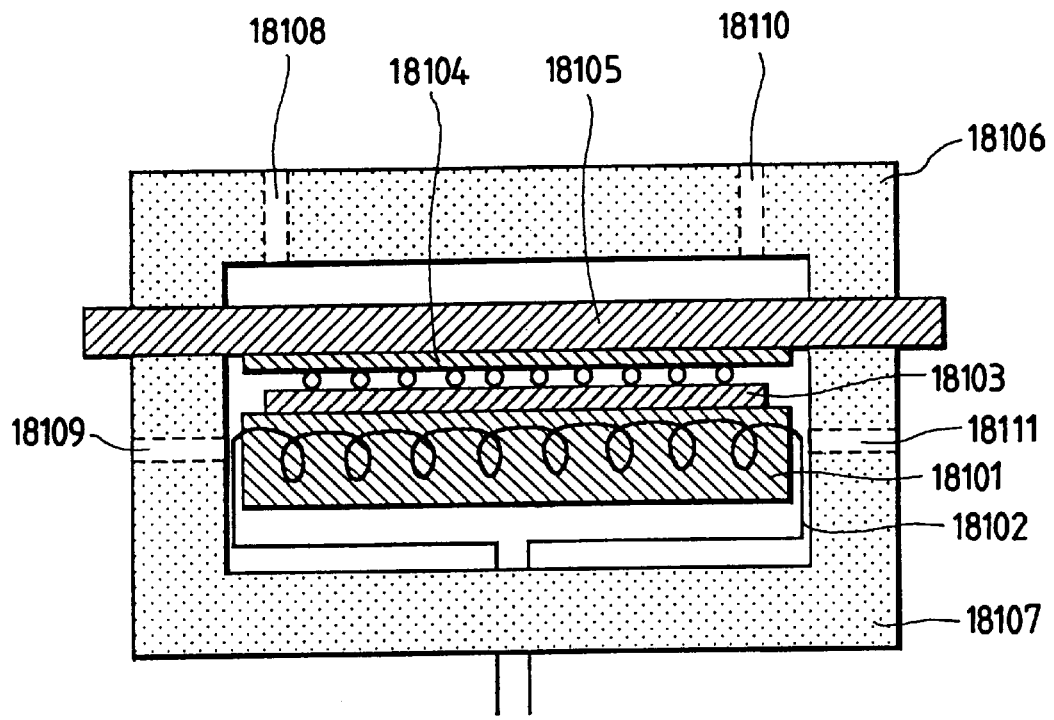
FIG. 18 illustrates schematically an apparatus suitable for formation of the electrode of the present invention.
Figure 19:
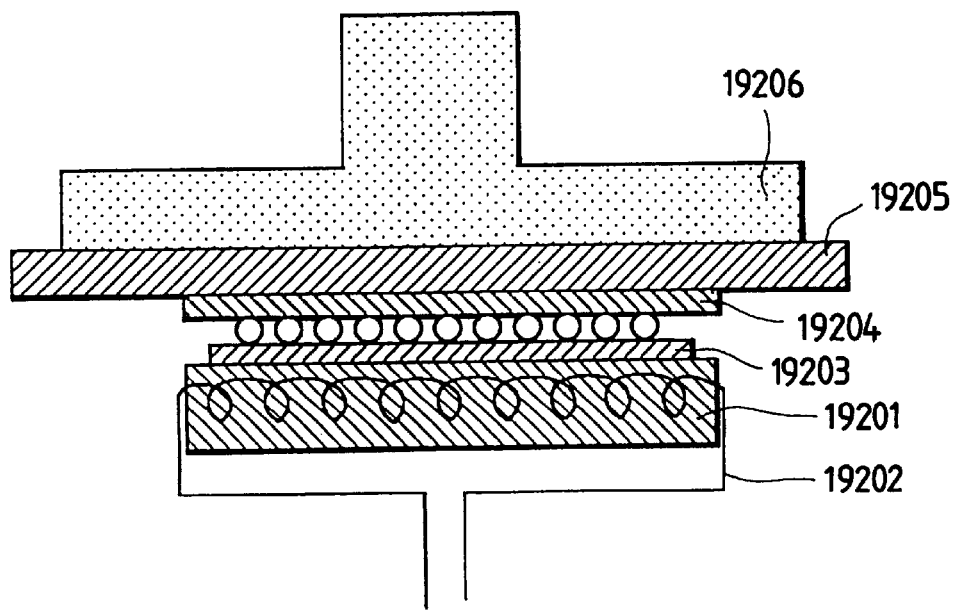
FIG. 19 illustrates schematically another apparatus suitable for formation of the electrode of the present invention.
Figure 20:
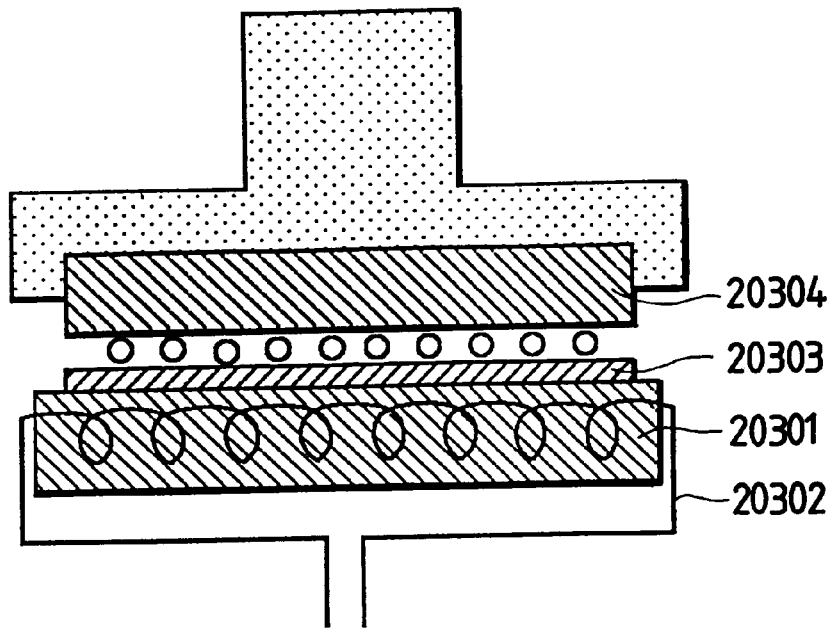
FIG. 20 illustrates schematically still another apparatus suitable for formation of the electrode of the present invention.

FIGS. 18 to 20 show apparatuses suitable for preparing the collecting electrode of the present invention.

FIG. 18 is a schematic sectional view of a vacuum heating apparatus. In FIG. 18, the numeral 18101 indicates a heating plate; 18102 a heater; 18103 a photovoltaic element; 18104 a resin film; 18105 a resin sheet; 18106 an upper chamber; 18107 a lower chamber; and 18108 and 18109 respective exhaust vents. The heating plate 18101 heats the photovoltaic element 18103 and simultaneously conducts adhesion by pressurization with the resin sheet 18105. When the photovoltaic element has a large area, the heater is controlled to keep the surface temperature uniform. The photovoltaic element 18103 is placed on the heating plate 18101 with the collecting electrode side directed upward. The resin film 18104 is employed as desired to prevent adhesion of the electroconductive adhesive to the resin sheet 18105, and to prevent transfer of oil or other component released from the resin sheet to the photovoltaic element. The material of the resin film is preferably a film of a known high polymer such as PFA and ETFE, having a thickness of about 100 $\mu$m thick.

The resin sheet 18105 is heat resistant and durable, and is employed for maintaining vacuum and applying the pressure uniformly. The materials thereof include elastic materials such as silicon rubber, fluororubber, and neoprene rubber. The thickness and the elasticity of the above sheet is selected as desired, and preferably is in the range of from 1 to 5 mm. With a thickness of less than 1 mm, compression strain is too small to apply pressure uniformly to the coated wire. With a thickness of more than 5 mm, the compression strain is too large to apply sufficient pressure to the coated wire, resulting in poor adhesion of the coated wire. The exhaust vents 18108, 18109 are connected to a vacuum pump not shown in the drawing, and the upper chamber 18106 and the lower chamber 18107 are evacuated. If desired, the lower chamber 18107 only may be evacuated and the upper chamber 18106 may be kept at atmospheric pressure.

FIG. 19 shows a heating apparatus not employing a vacuum. A pressing plate 19206 applies pressure uniformly to a photovoltaic element 19203. Although the temperature control is not necessary, a cooling means may be provided if desired.

FIG. 20 shows a heating apparatus suitable for treating a long photovoltaic element. In FIG. 20, the numeral 20304 indicates a roller. The roller 20304 may be formed by covering a material similar to the resin sheet 19205 with the resin film 19204 in FIG. 19. This apparatus is capable of applying pressure locally, and uniformly even if the photovoltaic element has a large area. The applied pressure ranges preferably from 1 to 10 kg/cm$^2$. With a lower pressure, the thermally softened electroconductive adhesive is not sufficiently squeezed, resulting in a smaller area of adhesion with the photovoltaic element and giving a higher series resistance, while with a higher pressure, the thermally softened photovoltaic element is squeezed and spread widely, resulting in a high shadow loss.

The above processes for producing the collecting electrode are characterized by softening of the electroconductive adhesive coating of the coated wire by heating of the face on which electrode is to be provided. The face for forming the electrode may be directed upwards or downward, provided that the electroconductive adhesive of the coated wire can be softened by the heat of the face of electrode formation.

The second electrode of the solar cell of the present invention is provided on the back face of the semiconductor layer, and is formed from a metal by screen printing, vapor deposition, or like method. The metal is selected from those which are capable of giving sufficient ohmic contact properties with the semiconductor. If the semiconductor layer is a thin film of amorphous silicon or the like, a supporting substrate is employed which may be insulating or electroconductive.

FIG. 23 is a schematic sectional view of an embodiment of such a solar cell. In FIG. 23, the numeral 23601 indicates a supporting substrate; 23602 a back side electrode, 23603, 23604, and 23605 respectively a semiconductor layer; 23606 a grid; and 23607 a light-transmissive electrode.

Examples of the present invention are now explained by reference to drawings.

EXAMPLE 1-1

Figure 1B:
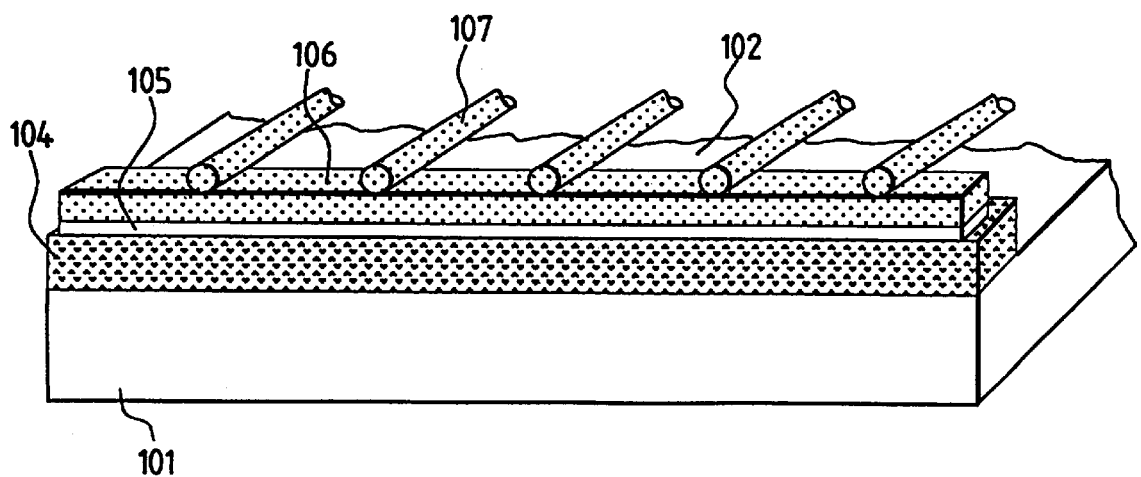

This example employs stainless steel as the substrate, and amorphous silicon as the photovoltaic element. FIGS. 1A and 1B illustrate the electrode structure schematically.

FIG. 1A is a schematic top view of the face having collecting electrode formed thereon. FIG. 1B is a perspective view of the cross-section taken along the line 1B—1B in FIG. 1A. The photovoltaic element 101 in FIGS. 1A and 1B has a structure constituted of the multiple layered film shown in Table 1.

TABLE 1

| Substrate or layer/Thickness | | Underlying face |
| --- | --- | --- |
| Stainless steel substrate | /125 µm | — |
| ZnO film | /50 nm | Stainless steel substrate |
| n-Type a-Si layer | /15 nm | ZnO film |
| i-Type a-Si layer | /400 nm | n-Type a-Si layer |
| p-Type a-Si layer | /10 nm | i-Type a-Si layer |
| ITO layer | /50 nm | p-Type a-Si layer |

Then on the surface of the photovoltaic element 101, a pattern 103 was screen-printed with a paste containing an ITO etching material (e.g., $FeCl_3$). The printed portion was washed with pure water to remove a portion of the ITO layer to form an etched groove 103 to ensure electrical separation between the surface electrode and the back face electrode.

Further, in order to ensure insulation between the surface electrode and the lower (back face) electrode, a polyimide insulation tape 104 of 130 µm thickness was adhered to the portion where the power generation region 102 is adjacent to the exposed face of the substrate.

On the surface of the polyimide insulation tape 104, a copper foil 106 of 100 µm thick (hard copper foil, produced by Fukuda Kinzoku K. K.) was fixed as a conductor for leading out the surface electrode by use of a heat-resistant double-face adhesive tape 105 (VHB 9460, produced by Sumitomo 3M K. K.).

The wires 107 shown in FIGS. 1A and 1B were prepared by preliminarily applying and drying an electroconductive adhesive on a copper wire of 100 µm diameter. The electroconductive adhesive was composed of an acrylic resin and carbon black of particle diameter of 3 to 5 µm as the pigment dispersed therein.

Figure 3:
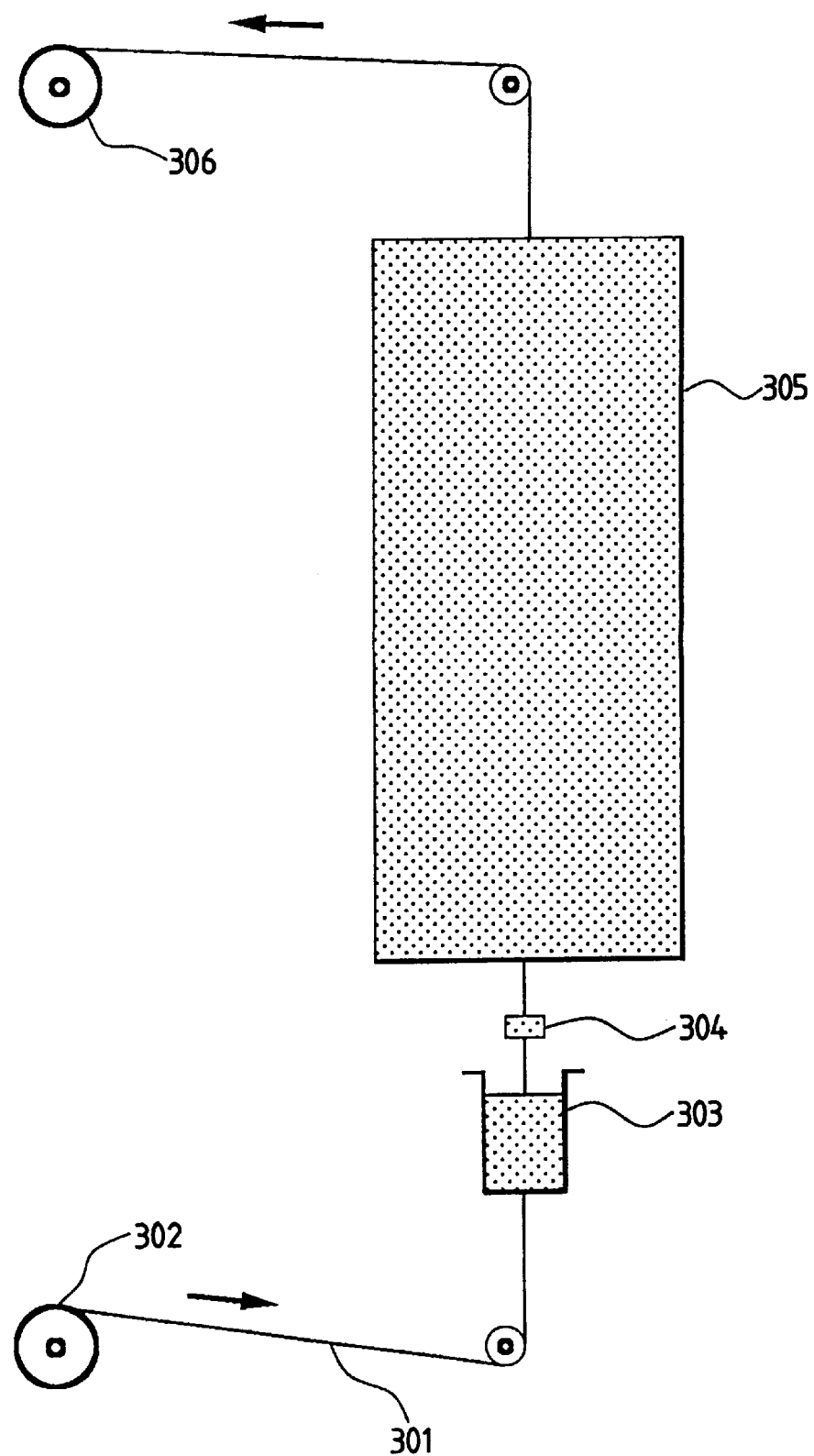
FIG. 3 illustrates schematically an apparatus for applying an electroconductive adhesive over the entire length of a metal wire employed in Example 1—1.

The process of applying the electroconductive adhesive on the copper wire is described with reference to FIG. 3. The copper wire 301 was delivered from the reel 302, and after passing through a container 303 storing the electroconductive adhesive, a die 304, and an IR furnace 305, was would up on a reel 306. The container 303 contained 200 cc of the electroconductive adhesive. The reel 306 was controlled to wind up the wire at a rate of 1 m/min. The copper wire 301 was passed through the container 303, coated with the electroconductive adhesive in a thickness of 40 to 50 µm by the die 304, dried in the IR furnace of 1 m length at the inner temperature of 120° C., and then wound up by the upper reel 306.

With the above electrode construction, the electric power generated in the amorphous silicon power generation region 102 of the present invention was collected by the copper wire coated with the electroconductive adhesive, and was outputted by the hard copper foil fixed to the copper wire. The power also was outputted through the back face reflecting ZnO layer as the back face electrode via the stainless substrate.

Figure 4:
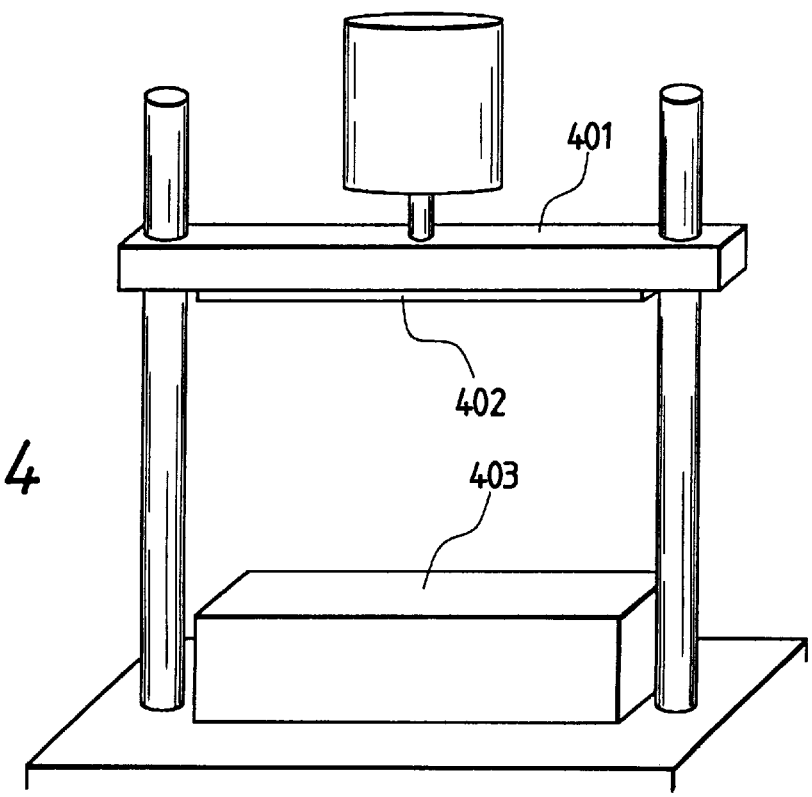
FIG. 4 illustrates schematically an apparatus employed in Example 1—1 for fixing the metal wire onto a conductor with an electroconductive adhesive.

The method of adhesion of the metal wire and the conductor is described below. The metal wire was coated on the entire surface thereof with the electroconductive adhesive as described above. FIG. 4 illustrates an apparatus employed for preparing the electrode structure shown in FIG. 1. This apparatus fixed the metal wire to the conductor by hot pressing. The pressing plate 401 was driven vertically by an air cylinder, and had a heating means therein. The pressing face of the pressing plate was covered with a heat-conductive cushioning material 402. A rest 403 for placing the substrate had a heater therein to heat the substrate. The heat-conductive cushioning material employed herein was a laminate of a fluororubber and a nonwoven aramid (Type TB, produced by Yamauchi K. K.). The substrate of the photovoltaic element which had the insulating tape, the heat resistance double adhesive tape, and the conductor formed thereon was placed on the rest 403 heated at 200° C. of the pressing apparatus. Then the copper wires which had been coated entirely with the hot-melt type electroconductive adhesive were arranged. Then it was hot-pressed with the pressing face lined with cushioning material 402 and heated at 200° C. at a pressure of 2 kg/cm$^2$ to fix the copper wire to the hard copper foil. This processing step took 2 seconds for substrate setting, 5 seconds for heating the substrate, 3 seconds for arranging the wire, 3 seconds for hot pressing, and 2 seconds for taking-out. Therefore, this step took only about 15 seconds. In the conventional process, paste application in spots and drying took about one hour. Therefore, the process of the present invention is highly suitable for mass production in comparison with the conventional method. The fixation of the copper wire onto the effective face of the photovoltaic element was conducted by preliminary application of a hot-melt type of electroconductive adhesive followed by hot pressing. Table 2 shows the evaluation results of the photovoltaic device A which had a collecting electrode connected with a conductor after the paste printing and photovoltaic device B which had a collecting electrode of construction of the present invention. The results were obtained with a photovoltaic element of 30 cm×30 cm having respectively the electrode formed as above.

TABLE 2

| | Photovoltaic device | | | |
| --- | --- | --- | --- | --- |
| | A Comparative Ex. | B Ex. 1-1 | C Ex. 1-2 | D Ex. 1-3 |
| Efficiency η (%) | 7.78 | 7.82 | 7.85 | 7.72 |
| Series resistance Rs (Ωcm$^2$) | 30.3 | 24.6 | 27.6 | 27.9 |
| Shunt resistance Rsh (kΩcm$^2$) | 80.5 | 102.1 | 76.4 | 92.2 |

The photovoltaic element B of this example of the present invention had the copper wire connected to the copper foil only by hot pressing. However, the photovoltaic device B of this example had a lower Rs of 24.6 Ωcm$^2$, while the photovoltaic element A of conventional type had a higher Rs of 30.3 Ωcm$^2$. Since the lower series resistance is preferred, the photovoltaic device having the collecting electrode of the construction of the present invention is considered to have no problem on electroconductivity. The photovoltaic device of the present invention exhibited a satisfactory conversion efficiency of 7.82%.

Further, temperature-humidity cycle tests were conducted with the device B, a sample having the copper wire fixed by soldering and a sample having the copper wire fixed by paste spot application. As a result, the photovoltaic device B of the present invention exhibited a deterioration rate of less than 5%, showing satisfactory long-term reliability.

Accordingly, the electrode structure of the present invention gives high initial performance and long-term reliability by a simple production process.

EXAMPLE 1-2

A photovoltaic element electrode was prepared in the same manner as in Example 1-1 except the four points below:

(1) The member 106 in FIGS. 1A and 1B was a silver foil of 100 μm thick;

(2) The members 107 in FIGS. 1A and 1B were aluminum wires of 100 μm diameter preliminarily coated with a thermosetting electroconductive resin adhesive in a thickness of 30 to 50 μm;

(3) The thermosetting electroconductive adhesive was a butyral resin containing a blocked isocyanate and a carbon filler dispersed therein; and (4) The hot pressing for fixation of the collecting electrodes to the conductor were conducted with a different time allotment of the respective steps, and a postcuring step was additionally conducted.

The collecting electrodes were fixed to the conductor by hot pressing through the steps of substrate setting in 2 seconds, wire arrangement in 3 seconds, substrate heating for 5 seconds, hot pressing for 10 seconds, taking-out for 2 seconds, and postcuring by an IR heater for 5 seconds. Through these steps, the aluminum wire was fixed to the silver foil.

The photovoltaic device C having the collecting electrode of the present invention had a series resistance Rs of 27.6 $\Omega cm^2$, and exhibited a conversion efficiency of 7.85% as shown in Table 2. It was confirmed that, even if the members 106 and 107 in FIGS. 1A and 1B are changed, the electrode structure can be produced by simple step by additionally providing a postcuring step, giving a high initial electrical performance. Further, photovoltaic elements having a collecting electrode fixed by soldering or paste spot application were subjected to temperature-humidity cycle tests, and the photovoltaic device C of the present invention exhibited deterioration of less than 5%, showing sufficient long-term reliability.

EXAMPLE 1-3

A photovoltaic element electrode was prepared in the same manner as in Example 1-1 except the four points below:

(1) The member 106 in FIGS. 1A and 1B was an aluminum foil of 100 μm thickness plated with tin in a thickness of about 1 μm;

(2) The member 107 in FIGS. 1A and 1B was a silver wire of 100 μm diameter preliminarily coated with a thermosetting electroconductive adhesive in a thickness of 40 to 50 μm;

(3) The thermosetting electroconductive adhesive was a urethane resin containing a blocked isocyanate, graphite, and ZnO dispersed therein; and (4) In the application of thermosetting electroconductive adhesive onto the silver wire, the wire delivery rate and the IR furnace temperature were changed, and the hot pressing for fixation of the collecting electrode to the conductor was conducted with different time allotment of the respective steps.

The wire was delivered at a delivery rate of 0.5 m/min, and the temperature of the IR furnace was set at 145° C. The collecting electrodes were fixed to the conductor by hot pressing through the steps of substrate setting in 2 seconds, wire arrangement in 3 seconds, substrate heating for 5 seconds, hot pressing for 20 seconds, and taking-out in 2 seconds. Through these steps, the silver wire was fixed to the tin-plated aluminum foil.

The photovoltaic device D having the collecting electrode of the present example had a series resistance Rs of 27.9 $\Omega cm^2$, and exhibited a conversion efficiency of 7.72% as shown in Table 2. It was confirmed that, even if the members 106 and 107 in FIGS. 1A and 1B are changed, the electrode structure can be produced from a different material by selecting the wire delivery rate and the IR furnace temperature, giving a high initial electrical performance. Further, the photovoltaic elements having a collecting electrode fixed by soldering or paste spot application were subjected to temperature-humidity cycle tests, and the photovoltaic device D of the present example exhibited deterioration of less than 5%, showing sufficient long term reliability.

As described above, the invention according to claim 1 enables simultaneous fixation of a metal wire electrode and output conductor by curing the aforementioned electroconductive adhesive, thereby enabling wide selection of the members 106 and 107, and the thermosetting electroconductive adhesive with sufficient electrical properties and long-term reliability at low production cost.

According to the present invention, the steps of application and curing of an the electroconductive adhesive, which are necessary in the conventional process, for connection of the collecting electrode and output electrode are omitted and the working process is simplified. Furthermore, during arrangement and curing of the metal wires on the electrode formation face, the output conductor can be simultaneously fixed with the aforementioned electroconductive adhesive, whereby the mass production line can be constructed simply and made flexible with low production cost.

EXAMPLE 2-1

In this example, the collecting electrode was treated for rust prevention to maintain the solar cell performance even in severe environmental conditions.

The coating of the metal with an electroconductive resin was conducted by use of the apparatus shown in FIG. 8. A copper wire 8301 of 100 μm diameter was stretched by passing it from a supply reel 8302 through a stretching device 8303. The stretched copper wire was passed through a cleaning vessel 8304 holding an acetone-impregnated felt to remove greasy matter on the surface, then passed through a treating vessel 8305 holding a felt impregnated with 1,2,3-benzotriazole as a benzotriazole type rust preventive, and further passed through a drying furnace.

Subsequently, the copper wire was passed through a coater 8307 holding a coating material which had been prepared by dispersing 25 parts by weight of carbon black, 65 parts by weight of a urethane resin, and 10 parts by weight of a blocked isocyanate as a curing agent in 80 parts by weight of a mixed solvent of IPA and ethyl acetate by means of a paint shaker not shown in the drawing. Then the wire was passed through a die 8308 of PVF (manufactured by Osaka Diamond K. K.) to remove unnecessary paste, and through a curing-drying furnace 8309. The drying furnace 8306 and the curing-drying furnace 8309 were respectively an infrared furnace SS-09 (manufactured by Sakaguchi Dennetsu K. K.).

The copper wire after degreasing, rust-prevention, application of the coating material, and drying was wound up on a take-up reel 8313. The electroconductive resin layer had a specific resistance of 1.0 Ωcm.

The surface of the above prepared electrode wire was observed. Then the electrode was rapidly drawn to cause breaking according to JIS C-3003, and the broken portion was observed to evaluate the adhesion of the resin layer. Separately, another one of the electrode wires was kept in an environmental test apparatus at a temperature of 85° C. and a humidity of 85% RH for 1000 hours (high-temperature high-humidity test), and the state of the electrode wire surface and the adhesion of the coating were observed similarly. The results are shown in Table 3.

EXAMPLE 2-2

An electrode was formed in the same manner as in Example 2-1 except that 2-alkylimidazole was used as the imidazole type rust preventative. The electroconductive resin layer had a specific resistance of 5.3 Ωcm. The surface state and the adhesion were evaluated in the same manner as in Example 2-1. The results are shown in Table 3.

EXAMPLE 2-3

An electrode was formed in the same manner as in Example 2-1 except that 2-mercaptobenzimidazole was used as a mercaptan type rust preventive in place of the imidazole type rust preventive. The electroconductive resin layer had a specific resistance of 2.6 Ωcm. The surface state and the adhesion were evaluated in the same manner as in Example 2-1. The results are shown in Table 3.

EXAMPLE 2-4

An electrode was formed in the same manner as in Example 2-1 except that the electroconductive resin paste was replaced by the one composed of 25 parts by weight of graphite, 65 parts by weight of a butyral resin, 10 parts by weight of a blocked isocyanate as a curing agent, and 80 parts by weight of mixture of IPA and ethyl acetate as the solvent. The electroconductive resin layer had a specific resistance of 5.0 Ωcm. The surface state and the adhesion were evaluated in the same manner as in Example 2-1. The results are shown in Table 3.

EXAMPLE 2-5

An electrode was formed in the same manner as in Example 2-1 except that the electroconductive resin paste was replaced by one composed of 25 parts by weight of graphite, 75 parts by weight of a polyester resin, no curing agent, and 80 parts by weight of a mixture of IPA and ethyl acetate as the solvent. The electroconductive resin layer had a specific resistance of 5.2 Ωcm. The surface state and the adhesion were evaluated in the same manner as in Example 2-1. The results are shown in Table 3.

Comparative Example 2-1

In order to estimate the effect of the rust prevention treatment in the present invention, an electrode was formed in the same manner as in Example 2-1 except that the rust prevention treatment was not conducted. The uniform portion of the electroconductive resin layer had a specific resistance of 1.0 Ωcm. The surface state and the adhesion were evaluated in the same manner as in Example 2-1. The results are shown in Table 3.

TABLE 3

| | Initial surface state (line width) | Initial adhesiveness | Adhesiveness after high-temp. high-humidity test (Appearance) |
|---|---|---|---|
| Example | | | |
| 2-1 | Uniform | No cracking No peeling | No change |
| 2-2 | Uniform | No cracking No peeling | No change |
| 2-3 | Uniform | No cracking No peeling | No change |
| 2-4 | Uniform | No cracking No peeling | No change |
| 2-5 | Uniform | No cracking No peeling | No change |
| Comparative Example | | | |
| 2-1 | Partly non-uniform | Partly cracked | Many cracks Many peelings |

As seen from Table 3, the electrodes prepared with treatment for rust prevention of the present invention had uniform coating without shedding, and uniform line widths with satisfactory adhesion of the coating. Even after the severe high-temperature high-humidity environmental test for a long time, the adhesion of the coating were retained without cracking and peeling, and the electrodes were highly reliable.

EXAMPLE 2-6

An amorphous solar cell 9400 of pin-junction type single cell construction was prepared which had a layer construction as shown in FIG. 9 and had a grid electrodes each having a length of 30 cm.

A stainless steel substrate 9401 of SUS430BA having been sufficiently degreased and washed, was placed in a DC sputtering system (not shown in the drawing), and Ag was deposited in a thickness of 400 nm, and then ZnO in a thickness of 400 nm was deposited thereon to form a lower electrode 9402. The substrate was transferred to an RF plasma CVD apparatus (not shown in the drawing), and amorphous silicon semiconductor layers consisting of an n-layer 9403, an i-layer 9404, and a p-layer 9405 were deposited successively in the named order. Then the substrate was placed in a resistance-heating type of vapor deposition apparatus (not shown in the drawing), and a 70 nm thick ITO film 9406 was deposited at a film forming temperature of 170° C. to form a light-transmissive electroconductive film serving also to prevent reflection.

In the same manner as in Example 2-1, an electrode wire was prepared from a copper wire by degreasing, rust prevention, application, and drying of an electroconductive resin. The electrodes were arranged on the upper electrode 9406 by a wiring apparatus (not shown in the drawing), and the both ends of the electrodes were fixed temporarily by an adhesive. The used electroconductive resin paint was composed of 25 parts by weight of carbon black, 65 parts by weight of a urethane resin, 10 parts of a blocked isocyanate as a curing agent, and 80 parts by weight of a mixed solvent of IPA and ethyl acetate. The electroconductive resin layer had a specific resistance of 1.0 Ωcm, and a thickness of 12 μm. Then grid electrodes 9407 were prepared by fixing the wire electrodes on the upper electrode 9406 by utilizing the electroconductive resin applied on the wire by means of a hot pressing apparatus (not shown in the drawing). Ten samples of solar cells were prepared in the same manner as above.

To the respective solar cells, a tab 11601 was connected which was a cooper foil having an adhesive layer of 5 mm wide thereon, and further an anode output terminal member 11602, and cathode output terminal member 11603 were connected by soldering to prepare a single cell of 30 cm square as shown in FIG. 11.

The amorphous solar cell having the formed electrodes was encapsulated as follows. EVA resin sheets were overlaid on both faces of the amorphous solar cell 9400, and further thereon a fluororesin film ETFE (ethylene-tetrafluorethylene copolymer, trade name: Tefzel, produced by DuPont) was overlaid. The cell with the overlaid films was placed in a vacuum laminator, and the films were vacuum-laminated at 150° C. for 45 minutes.

The initial performances of the resulting solar cells were measured by using a simulated sunlight of 100 mW/cm$^2$ intensity as a global sunlight spectrum of AM 1.5. As the result, the conversion efficiency was 6.5±0.5%, the shunt resistance (in a dark state) was not less than 50 kΩcm$^2$, and the series resistance was 9.1 Ωcm$^2$ on average.

The reliability of this solar cell was tested according to the temperature-humidity cycle test A-2 defined in JIS C-8917 as the environmental test method and durability test for crystalline solar cell modules. In practice, the solar cell was placed in a thermo-hygrostat, and was subjected to 20 cycles of temperature change from −40° C. to +85° C. at a relative humidity of 85%. The solar cell performances were measured with the aforementioned simulated sunlight after every 10 cycles in the same manner as in the measurement of the initial performance.

Figure 12:
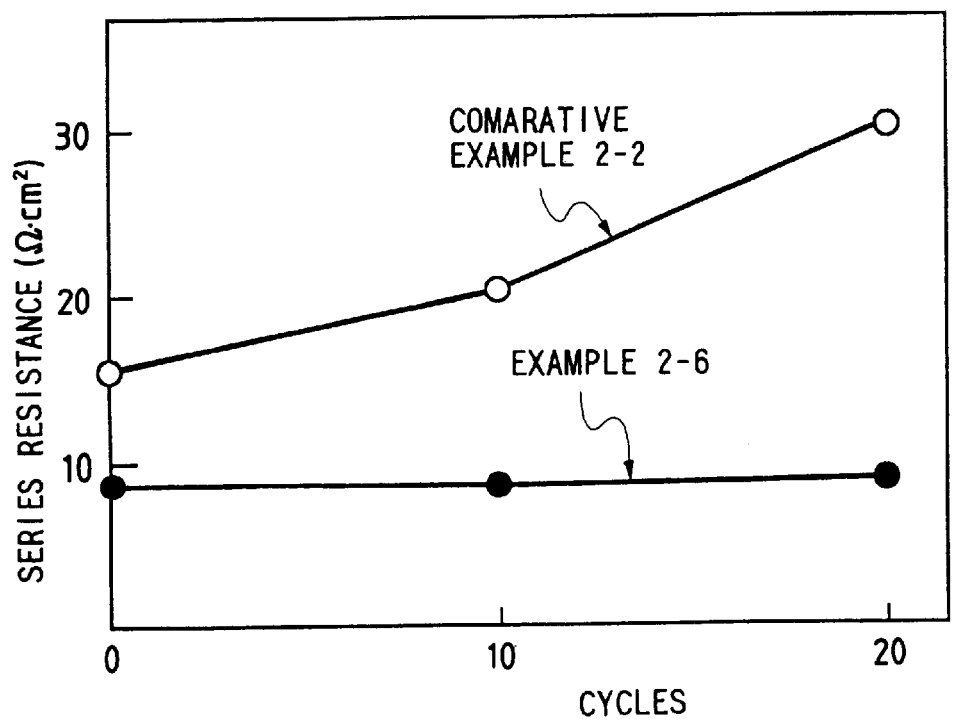
FIG. 12 is a graph showing change of series resistance by a temperature-humidity cycle test.

After the 20-cycle test, the conversion efficiency dropped by 3% on average, and the shunt resistance (in a dark state) dropped by 10% on average, the deterioration not being significant. The series resistance increased only by 2% on average as shown in FIG. 12, and peeling at the electrode was not observed.

The results of this Example show that the solar cell of the present invention exhibits excellent performance and is highly reliable.

Comparative Example 2-2

The electrode wire material was prepared and 10 amorphous solar cells were prepared and encapsulated in the same manner as in Example 2-6 except that the rust prevention treatment of the wire was not conducted.

The initial performance was measured in the same manner as in Example 2-6. The initial conversion efficiency was 4.8±2.0%. The series resistance was 15.5 Ωcm$^2$ on average, which was higher than that of the cells of Example 2-6.

The reliability test was conducted in the same manner as in Example 2-6. After 20 cycles of the temperature-humidity change, the conversion efficiency dropped by about 17% on average, the deterioration being significant. The series resistance increased with lapse of time as shown in FIG. 12, and increased to twice the initial value, which shows the deterioration of adhesion between the electrodes.

EXAMPLE 2-7

Figure 10:
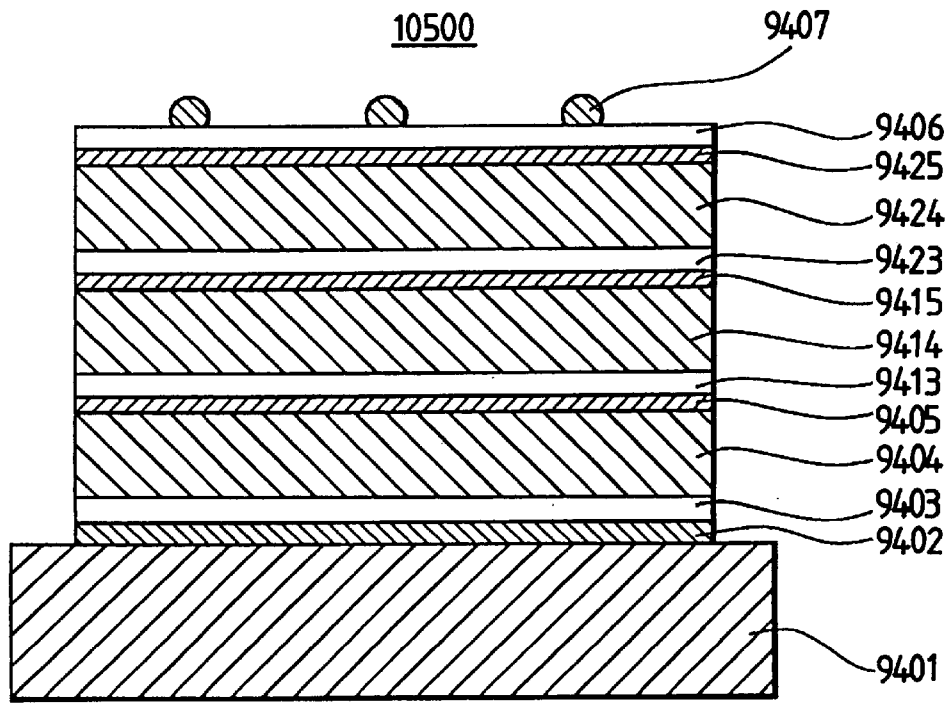
FIG. 10 illustrates schematically the constitution of a triple junction of photovoltaic element of the present invention.

An amorphous solar cell 10500 of triple junction type as shown in FIG. 10 was prepared in nearly the same manner as in Example 2-6 except that the junction construction was changed to a triple type and microwave CVD was employed for formation of the semiconductor layers.

A lower electrode 9402 composed of Ag and ZnO was formed on a SUS substrate 9401. It was then placed in a microwave plasma CVD apparatus (not shown in the drawing). Then a bottom semiconductor junction layer was formed by forming an n-layer 9403, an i-layer 9404, and a p-layer 9405 in the named order; a middle semiconductor junction layer was formed by similarly forming an n-layer 9413, an i-layer 9414, and a p-layer 9415 in the named order; and a top junction layer was formed by forming similarly an n-layer 9423, an i-layer 9424, and a p-layer 9425 in the named order, thus laminating the semiconductor layers. Then an ITO film 9406 which was a light-transmissive electroconductive film serving also to prevent reflection was formed at a film forming temperature of 170° C. and a film thickness of 70 nm in the same manner as in Example 2-6.

Separately, an electrode wire was prepared from a copper wire by degreasing, rust prevention, application and drying of an electroconductive resin in the same manner as in Example 2-1. The electrodes were arranged on the upper electrode 9406 by a wiring apparatus (not shown in the drawing), and both ends of the electrodes were fixed temporarily by an adhesive. The electroconductive resin was composed of 25 parts by weight of powdered ITO, 65 parts by weight of a butyral resin, 10 parts of a blocked isocyanate as a curing agent, and 80 parts by weight of a mixed solvent of IPA and ethyl acetate. The electroconductive resin layer had a specific resistance of 6.0 Ωcm, and a thickness of 15 μm.

Ten electrodes 9407 in total were prepared by fixing the wire electrodes on the upper electrode 9406 by utilizing the electroconductive resin applied on the wire by means of a hot pressing apparatus (not shown in the drawing). To the solar cell, a tab 11601 was connected which was a copper foil having an adhesive layer of 5 mm width thereon, and further an anode output terminal member 11602, and cathode output terminal member 11603 were connected by soldering to prepare a triple cell of 30 cm square as shown in FIG. 11. Ten samples of the solar cells were prepared in the same manner.

The obtained solar cells were encapsulated in the same manner as in Example 2-6. The initial performance of the resulting solar cells was measured in the same manner as in Example 2-6. As a result, the initial conversion efficiency was 8.3±0.4%, and the series resistance was 32.0 Ωcm$^2$ on average, and the variation of the properties was small.

The reliability of this solar cell was tested in the same manner as in Example 2-6. As the result of the 20-cycle test, the series resistance increased by 2.5% on average relative to the initial value, but the conversion efficiency decreased only by 1.5% on average relative to the initial value, not showing significant deterioration.

The results of this Example show that the solar cell of the present invention exhibits excellent performance and is highly reliable.

EXAMPLE 2-8

Four kinds of electroconductive resins were prepared in the same manner as in Example 2-6 except that the ratios of the sum of the weight of the polymer resin and the curing agent to the weight of the electroconductive particles in the resins were 10:90, 20:80, 80:20, and 95:5, thereby changing the specific resistance of the electroconductive resin layer to 0.01, 0.1, 100, and 200 Ωcm. The thickness of the resin layer was controlled to be 15 μm throughout the experiment.

Ten triple-junction type cells as shown in FIG. 10 were prepared in the same manner as in Example 2-7 for each of these electroconductive resins.

The solar cells were evaluated in the same manner as in Example 2-7. The results are shown in Table 4.

TABLE 4

|  | Specific resistance Ωcm | | | |
| --- | --- | --- | --- | --- |
|  | 0.01 | 0.1 | 100 | 200 |
| Initial stage | | | | |
| Conversion efficiency (%) | 8.7 | 8.5 | 8.1 | 6.3 |
| Series resistance (Ωcm²) | 29.3 | 30.5 | 34.9 | 53.8 |
| Shunt resistance (kΩcm²) | 15.0 | 50.0 | 51.3 | 60.7 |
| After reliability test | | | | |
| Conversion efficiency (%) | 8.6 | 8.4 | 8.0 | 5.4 |
| Series resistance (Ωcm²) | 29.8 | 30.9 | 36.0 | 68.7 |
| Shunt resistance (kΩcm²) | 14.6 | 50.0 | 50.9 | 60.5 |

Table 4 shows that the shunting is suppressed and conversion efficiency is kept stable by controlling the specific resistance of the electroconductive resin layer to be not lower than 0.1 Ωcm, and that the series resistance is lower and the conversion efficiency is higher when the specific resistance of the electroconductive resin layer is not higher than 100 Ωcm. Table 4 also shows that, in the reliability test, the increase of the series resistance is less, the decrease of the conversion efficiency is less, and the reliability is higher in the above specific resistance range.

Comparative Example 2-3

Triple junction-type cells were prepared in the same manner as in Example 2-7 except that the rust prevention treatment was not conducted, and the electroconductive filler in the electroconductive resin was changed to particulate silver. The electroconductive layer had a specific resistance of $5 \times 10^{-5}$ Ωcm, and a thickness of 15 μm.

The cell samples were encapsulated and the initial properties were measured in the same manner as in Example 2-7. The initial conversion efficiency was 6.0±2.0%, the series resistance was 50 Ωcm² on average, and the shunt resistance (in a dark state) was 1.0 kΩcm².

EXAMPLE 3-1

In this Example, a coupling agent was used to make the collecting electrode resistant to severe environmental conditions.

The electrode wire was prepared as follows. The coating of the metal wire with an electroconductive adhesive was conducted by use of the apparatus shown in FIG. 8. A copper wire 8301 of 100 μm diameter was stretched by delivering from a supply reel 8302 through a stretching device 8303. The stretched copper wire was passed through a cleaning vessel 8304 holding an acetone-impregnated felt to remove any greasy matter on the surface, then passed through a treating vessel 8305 holding a felt impregnated with a silane type coupling agent, and further passed through a drying furnace 8306.

Subsequently, the copper wire was passed through a coater 8307 containing a coating material which had been prepared by dispersing 25 parts by weight of carbon black, 65 parts by weight of urethane resin, and 10 parts by weight of a blocked isocyanate as a curing agent in 80 parts by weight of a mixed solvent of IPA and ethyl acetate by means of a paint shaker (not shown in the drawing). Then the wire was passed through a die 8308 of PVF (manufactured by Osaka Diamond K. K.) to remove unnecessary coating material, and through a curing-drying furnace 8309. The drying furnace 8306 and the curing-drying furnace 8309 were respectively an infrared furnace SS-09 manufactured by Sakaguchi Dennetsu K. K.

The copper wire after degreasing, treating with a coupling agent, application of the coating material, and drying was wound up by a take-up reel 8313. The specific resistance of the electroconductive resin layer was 1.0 Ωcm.

The surface of the above prepared electrode wire was observed. Then the electrode wire was rapidly drawn to cause breaking according to JIS C-3003, and the broken portion was observed to evaluate the adhesion of the resin layer. Separately, the electrode was kept in an environmental test apparatus at a temperature of 85° C. and a humidity of 85% RH for 1000 hours (high-temperature high-humidity test), and the electrode surface and the adhesion were observed similarly. The results are shown in Table 5.

EXAMPLE 3-2

An electrode wire was prepared in the same manner as in Example 3-1 except that the coupling agent was changed to a titanate type coupling agent (Prennact KRTTS, produced by Ajinomoto Co. Ltd.). The electroconductive resin layer had a specific resistance of 1.2 Ωcm. The surface state and the adhesion were evaluated in the same manner as in Example 3-1. The results are shown in Table 5.

EXAMPLE 3-3

An electrode wire was prepared in the same manner as in Example 3-1 except that the coupling agent was changed to an aluminum type coupling agent (Prennact AL-M, produced by Ajinomoto Co., Ltd.). The electroconductive resin layer had a specific resistance of 1.5 Ωcm. The surface state and the adhesion were evaluated in the same manner as in Example 3-1. The results are shown in Table 5.

EXAMPLE 3-4

An electrode wire was prepared in the same manner as in Example 3-1 except that the coating material was replaced by one composed of 25 parts by weight of $SnO_2$, 65 parts by weight of an epoxy resin, 10 parts by weight of a phenol resin as a curing agent, and 80 parts by weight of a mixture of IPA and ethyl acetate as the solvent. The electroconductive resin layer had a specific resistance of 8.8 Ωcm. The surface state and the adhesion were evaluated in the same manner as in Example 3-1. The results are shown in Table 5.

EXAMPLE 3-5

An electrode wire was prepared in the same manner as in Example 3-1 except that the coating material was replaced by the one composed of 25 parts by weight of ITO, 75 parts by weight of a polyester resin, no curing agent, and 80 parts by weight of a mixture of IPA and ethyl acetate as the solvent. The electroconductive resin layer had a specific resistance of 7.9 Ωcm. The surface state and the adhesion were evaluated in the same manner as in Example 3-1. The results are shown in Table 5.

Comparative Example 3-1

An electrode wire was prepared in the same manner as in Example 2-1 except that the coupling agent treatment was not conducted, whereby the effect of the coupling agent could be studied. The uniform portion of the electroconductive resin layer had a specific resistance of 1.0 Ωcm. The surface state and the adhesion were evaluated in the same manner as in Example 3-1. The results are shown in Table 5.

TABLE 5

| | Initial surface state (line width) | Initial adhesion | Adhesion after high-temp. high-humidity test (Appearance) |
|---|---|---|---|
| Example | | | |
| 3-1 | Uniform | No cracking No peeling | No change |
| 3-2 | Uniform | No cracking No peeling | No change |
| 3-3 | Uniform | No cracking No peeling | No change |
| 3-4 | Uniform | No cracking No peeling | No change |
| 3-5 | Uniform | No cracking No peeling | No change |
| Comparative Example | | | |
| 3-1 | Partly non-uniform | Partly cracked | Many cracks Much peeling |

As seen from Table 5, the electrode wires prepared with coupling agent treatment of the present invention had uniform coating without shedding, and uniform line widths with satisfactory adhesion of the coating. Even after the severe high-temperature high-humidity environmental test for a long time, the adhesion of the coating was retained without cracking and peeling, and the electrode wires were highly reliable.

EXAMPLE 3-6

A solar cell 9400 of single pin-junction type construction was prepared which had a layer construction as shown in FIG. 9 and had a grid electrodes having a length of 30 cm.

A stainless steel substrate 9401 of SUS430BA having been sufficiently degreased and washed was placed in a DC sputtering system (not shown in the drawing), and Ag was deposited in a thickness of 400 nm, and then ZnO in a thickness of 400 nm was deposited thereon to form a lower electrode 9402. The substrate was transferred to an RF plasma CVD apparatus (not shown in the drawing), and amorphous silicon semiconductor layers consisting of an n-type 9403, and i-layer 9404, and p-layer 9405 were deposited successively in the named order. Then the substrate was placed in a resistance-heating type of vapor deposition apparatus (not shown in the drawing), and a 70 nm thick ITO film 9406 was deposited at a film forming temperature of 170° C. as a light-transmissive electroconductive film serving also to prevent reflection.

Separately, an electrode wire was prepared from a copper wire by degreasing, coupling agent treatment, and application and drying of a coating material. Pieces of the electrode wire were arranged on the upper electrode 9406 by a wiring apparatus (not shown in the drawing), and both ends of the electrodes were fixed temporarily by an adhesive. The coating material was composed of 25 parts by weight of carbon black, 65 parts by weight of a urethane resin, 10 parts of a blocked isocyanate as a curing agent, and 80 parts by weight of a mixed solvent of IPA and ethyl acetate. The electroconductive resin layer had a specific resistance of 1.0 Ωcm, and a thickness of 15 μm. The grid electrodes 9407 were prepared by fixing the electrode wire pieces on the upper electrode 9406 by utilizing the electroconductive resin applied on the wire by means of a hot pressing apparatus (not shown in the drawing). Ten samples of the solar cells were prepared in the same manner as above.

To the respective solar cells, a tab 11601 was connected which was a copper foil having an adhesive layer of 5 mm width thereon, and further an anode output terminal member 11602, and cathode output terminal member 11603 were connected by soldering to prepare a single cell of 30 cm square as shown in FIG. 11.

The amorphous solar cell having the formed electrodes was encapsulated as follows. EVA resin sheets were overlaid on the each of the faces of the amorphous solar cell 9400, and further thereon a fluoroplastic film ETFE (ethylenetetrafluoroethylene copolymer, trade name: Tefzel, produced by DuPont) was overlaid. The cell with the overlaid films was placed in a vacuum laminator, and the films were vacuum-laminated at 150° C. for 45 minutes.

The initial performances of the resulting solar cells were measured by using a simulated sunlight of global sunlight spectrum of AM 1.5 light intensity of 100 mW/cm$^2$. As a result, the conversion efficiency was 6.7±0.5%, the shunt resistance (in a dark state) was not less than 50 kΩcm$^2$, and the series resistance was 9.5 Ωcm$^2$ on average.

The reliability of this solar cell was tested according to the temperature-humidity cycle test A-2 defined in JIS C-8917 as the environmental test method and durability test for crystalline solar cell modules. In practice, the solar cell was placed in a thermo-hygrostat, and was subjected to 20 cycles of temperature change from −40° C. to +85° C. (at a relative humidity of 85%). The solar cell performances were measured with the aforementioned simulated sunlight after every 10 cycles in the same manner as in the measurement of initial performance.

Figure 13:
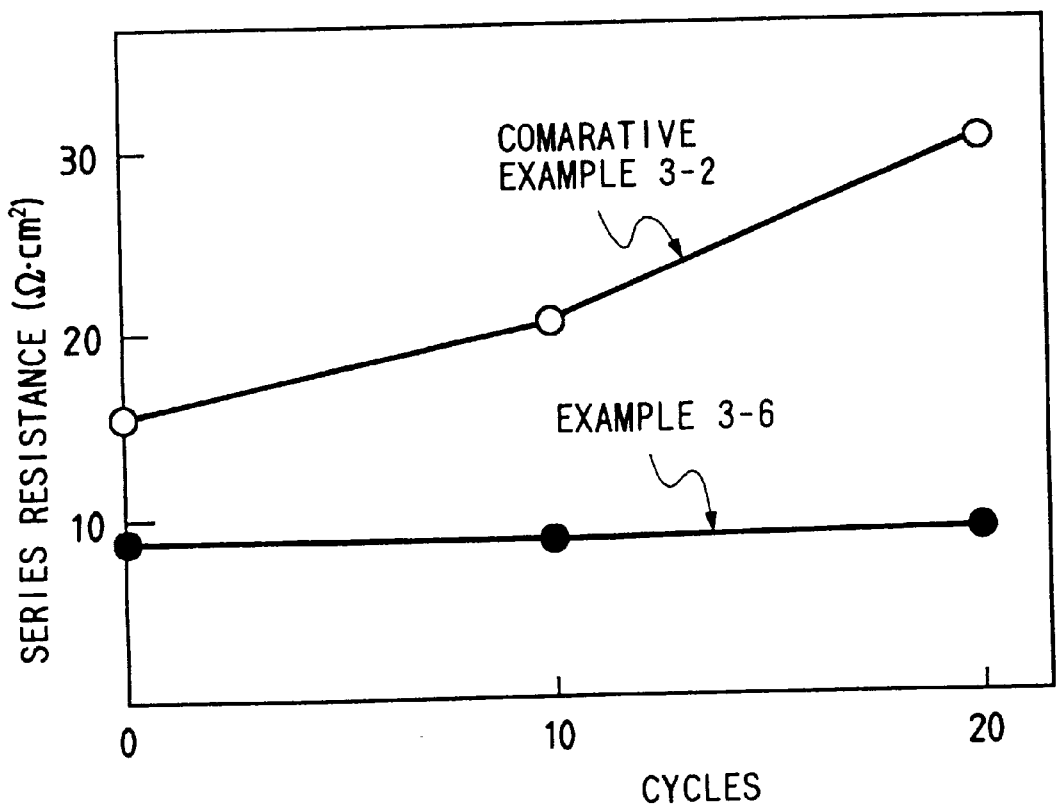
FIG. 13 is a graph showing change of series resistance by a temperature-humidity cycle test.

After the 20-cycle test, the conversion efficiency decreased by 3.2% on average, and the shunt resistance (in a dark state) decreased by 10% on average, the deterioration being not significant. The series resistance increased only by 2.4% on average as shown in FIG. 13, and peeling at the electrodes was not observed.

The results of this Example show that the solar cell of the present invention exhibits excellent performances and is highly reliable.

Comparative Example 3-2

An electrode wire was prepared in the same manner as in Example 3-1, and 10 amorphous solar cells were prepared in the same manner as in Example 3-6 except that the coupling agent treatment was not conducted. These samples were encapsulated in the same manner as in Example 3-6.

The initial performance of the samples was measured in the same manner as in Example 3-6. The initial conversion efficiency was 5.8±2.1%, which is lower than that of Example 3-1 and the variation thereof was large. The series resistance was 15.5 Ωcm$^2$ on average, which was higher than that of the cells of Example 3-6.

The reliability test was conducted in the same manner as in Example 3-6. After 20 cycles of the temperature-humidity change, the conversion efficiency decreased by about 17%, the deterioration being significant. The series resistance increased with lapse of time as shown in FIG. 13, and increased to double the initial value, which shows the deterioration of adhesion between the electrodes.

EXAMPLE 3-7

An amorphous solar cell 10500 of triple type as shown in FIG. 10 was prepared in nearly the same manner as in Example 3-4 except that the construction was changed to a triple junction type and microwave CVD was employed for formation of the semiconductor layers.

A lower electrode 9402 composed of Ag and ZnO was formed on a SUS substrate 9401. It was then placed in a microwave plasma CVD apparatus (not shown in the drawing). Then a bottom semiconductor junction was formed by forming an n-layer 9403, an i-layer 9404, and a p-layer 9405 in the named order; a middle semiconductor junction was formed by similarly forming an n-layer 9413, an i-layer 9414, and a p-layer 9415 in the named order; and a top junction layer was formed by similarly forming an n-layer 9423, an i-layer 9424, and a p-layer 9425 in the named order, thus laminating the semiconductor layers. Then an ITO film 9406 which was a light-transmissive electroconductive film serving also to prevent reflection was formed at a film forming temperature of 170° C. and a film thickness of 70 nm in the same manner as in Example 3-5.

Separately, an electrode wire was prepared from a copper wire by degreasing, coupling agent treatment, and application and drying of an electroconductive resin in the same manner as in Example 3-1. Pieces of the electrode wire were arranged on the upper electrode 9406 by a wiring apparatus not shown in the drawing, and both ends of the wire pieces were fixed temporarily by an adhesive. The electroconductive resin was composed of 25 parts by weight of powdered ITO, 65 parts by weight of a butyral resin, 10 parts of a blocked isocyanate as a curing agent, and 80 parts by weight of a mixed solvent of IPA and ethyl acetate.

The electroconductive resin layer had a specific resistance of 7.2 $\Omega$cm, and a thickness of 18 $\mu$m.

The electrodes 9407 were prepared by fixing the wire electrode pieces on the upper electrode 9406 by utilizing the electroconductive resin applied on the wire by means of a hot pressing apparatus not shown in the drawing. To the solar cell, a tab 11601 was connected which was a copper foil having an adhesive layer of 5 mm width thereon, and further an anode output terminal member 11602, and cathode output terminal member 11603 were connected by soldering to prepare a triple cell of 30 cm square as shown in FIG. 11. Then samples of the solar cells were prepared in the same manner as above.

The obtained solar cells were encapsulated in the same manner as in Example 3-6. The initial performance of the resulting solar cells was measured in the same manner as in Example 3-6. The satisfactory results showed the initial conversion efficiency was 8.3±0.3%, the shunt resistance (in a dark state) was not less than 42 k$\Omega$cm$^2$, and the series resistance was 33.0 $\Omega$cm$^2$ on average.

The reliability of this solar cell was tested in the same manner as in Example 3-6. As a result of the 20-cycle test, the series resistance increased by 2.7% on average relative to the initial value, but the conversion efficiency decreased only by 1.8% on average relative to the initial value, not showing significant deterioration.

The results of this Example show that the solar cell of the present invention exhibits excellent performances and is highly reliable.

EXAMPLE 3-8

Amorphous solar cells of triple junction type as shown in FIG. 10 were prepared in nearly the same manner as in Example 3-6 except that the ratio of the sum of the weight of the polymer resin and of the curing agent to the weight of the electroconductive particles in the electroconductive resin was changed to 10:90, 20:80, 80:20, and 95:5, thereby changing the specific resistance of the electroconductive resin layer to 0.01, 0.1, 100, and 200 $\Omega$cm. Ten solar cells were prepared for each of the specific resistances. The solar cells were evaluated in the same manner as in Example 3-7. The results are shown in Table 6.

TABLE 6

|  | Specific resistance $\Omega$cm | | | |
| --- | --- | --- | --- | --- |
|  | 0.01 | 0.1 | 100 | 200 |
| Initial stage | | | | |
| Conversion efficiency (%) | 8.7 | 8.5 | 8.1 | 6.3 |
| Series resistance ($\Omega$cm$^2$) | 29.3 | 30.5 | 34.9 | 53.8 |
| Shunt resistance (k$\Omega$cm$^2$) | 15.0 | 50.0 | 51.3 | 60.7 |
| After reliability test | | | | |
| Conversion efficiency (%) | 8.6 | 8.4 | 8.0 | 5.4 |
| Series resistance ($\Omega$cm$^2$) | 29.8 | 30.9 | 36.0 | 68.7 |
| Shunt resistance (k$\Omega$cm$^2$) | 14.6 | 50.0 | 50.9 | 60.5 |

Table 6 shows that the shunting is suppressed and conversion efficiency is kept stable by controlling the specific resistance of the electroconductive resin layer to be not lower than 0.1 $\Omega$cm, and that the series resistance is lower and the conversion efficiency is higher when the specific resistance of the electroconductive resin layer is not higher than 100 $\Omega$cm. It also shows that the increase of the series resistance is less, the decrease of the conversion efficiency is less, and the reliability is higher in the above specific resistance range.

Comparative Example 3-3

Triple cells were prepared in the same manner as in Example 3-7 except that the coupling agent treatment was not conducted, and the electroconductive filler in the electroconductive resin was changed to particulate silver. The electroconductive layer had a specific resistance of 5×10$^{-5}$ $\Omega$cm, and a thickness of 20 $\mu$m.

The cell samples were encapsulated and the initial properties were measured in the same manner as in Example 3-7. The initial conversion efficiency was 6.0±2.0%, which is lower than that of Example 3-7, and the variation was larger. The series resistance was 50 $\Omega$cm$^2$ on average, and the shunt resistance (in a dark state) was 1.2 k$\Omega$cm$^2$.

The examples below show that the collecting electrode of the present invention is producible in a commercial quantity at a high yield and high productivity.

EXAMPLE 4-1

In this Example, a urethane resin containing powdered carbon dispersed therein was used as a first electroconductive adhesive, and an epoxy resin containing powdered silver was used as a second electroconductive adhesive.

Figure 14:
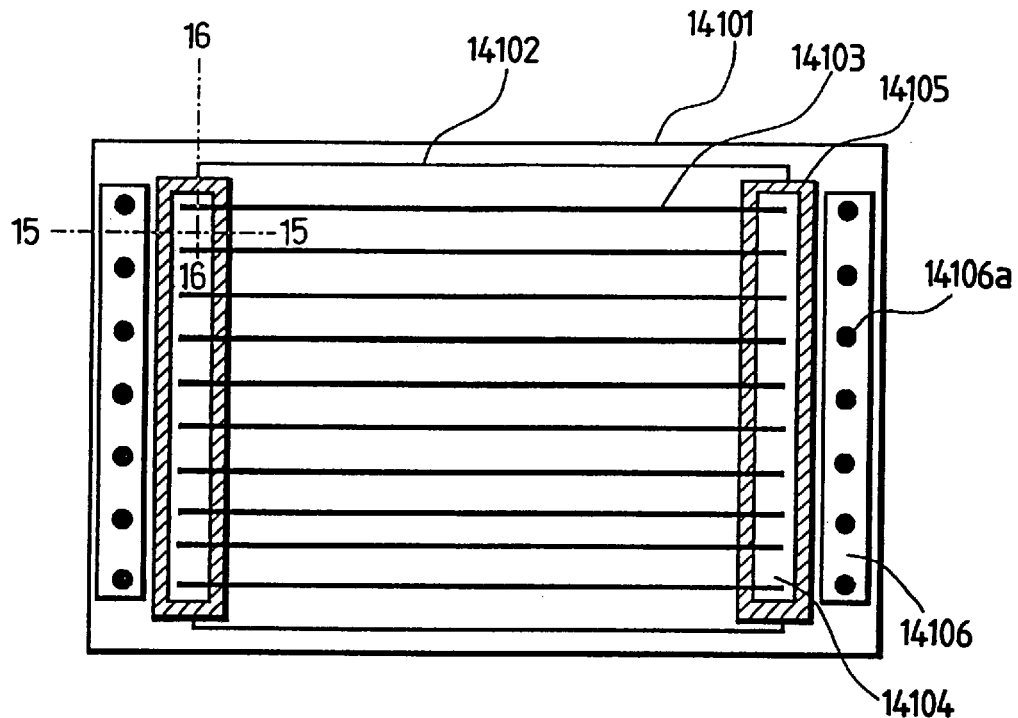
FIG. 14 illustrates schematically the external appearance of a photovoltaic element of the present invention.

FIG. 14 illustrates the external appearance of the photovoltaic element of this Example. The photovoltaic element 14101 in FIG. 14 comprises a substrate, an amorphous semiconductor layer for photoelectric conversion, and a light-transmissive electroconductive film as the front face electrode. The light-transmissive electroconductive film has a linear etched groove 14102. Collecting electrodes 14103 collect the electric power generated by the photovoltaic element. Terminal members 14104 are used for electrical connection with an adjacent photovoltaic element, or for outputting the power to the outside. Insulating members 14105 are provided for electrically insulating the terminal members 14104 from the surface of the photovoltaic element. Terminal members 14106 serving as the counter electrode of the photovoltaic element are connected mechanically and electrically with the electroconductive substrate of the photovoltaic element at contact points 14106a.

The linear etched groove 14102 was formed for the purpose of preventing short circuiting between the substrate and the light-transmissive electroconductive film which may occur from cutting the periphery of the element to protect the effective light-receiving area of the photovoltaic element. The linear etched groove 14102 was formed by applying an etching paste containing an etchant such as $FeCl_3$ and $AlCl_3$ on the light-transmissive electroconductive film by screen printing or other method, and partly removing the light-transmissive electroconductive film by heating.

The collecting electrodes 14103 were formed by applying the first electroconductive adhesive onto a copper wire of 100 μm diameter in a thickness of about 15 μm and drying it. Pieces of the copper wire were arranged as shown in FIG. 14, and were fixed onto the surface of the photovoltaic element and the terminal members 14104 by hot pressing.

The first electroconductive adhesive was prepared by dispersing with a shaker powdered carbon having a diameter of several thousand angstroms in a urethane resin at a content of 35% by weight.

Figure 15:
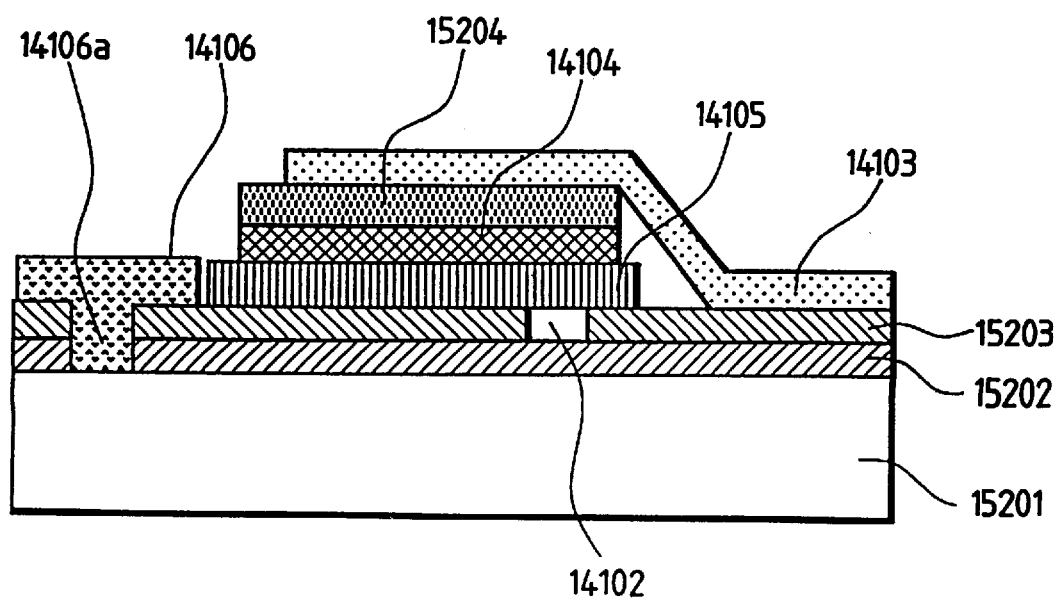
FIG. 15 is a schematic sectional view of a part of the photovoltaic element along the line 15—15 in FIG. 14.
Figure 16:
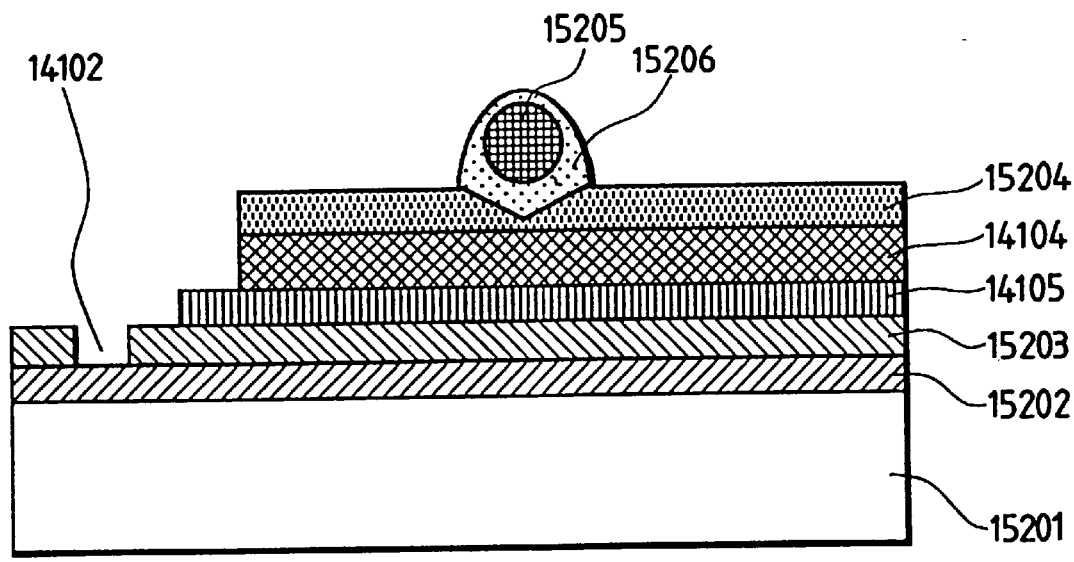
FIG. 16 is a schematic sectional view of a part of the photovoltaic element along the line 16—16 in FIG. 14.
Figure 17:
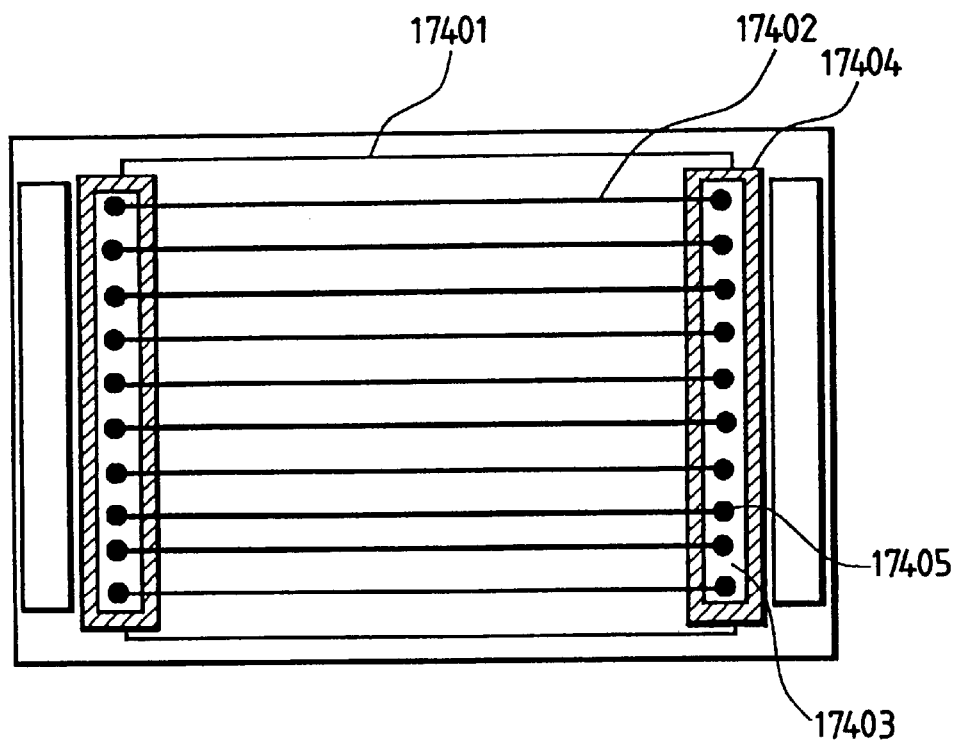
FIG. 17 illustrates schematically the external appearance of a photovoltaic element of the prior art for comparison.

FIG. 15 is a sectional view of the photovoltaic element of FIG. 14 along the line 15—15. FIG. 16 is a sectional view of the photovoltaic element of FIG. 14 along the line 16—16.

In FIG. 15, the substrate 15201 is a stainless steel plate of 125 μm thickness which supports the entire photovoltaic element. On the substrate 15201, a back-face reflection layer was provided, and thereon, a semiconductor layer 15202 composed of amorphous silicon layers was provided. The back-face reflection layer was formed by depositing Al and ZnO successively by sputtering each in a thickness of several thousand Å. The semiconductor layer 15202 constituted amorphous silicon layers, in this Example, was formed by successively depositing layers of n-type, i-type, p-type, n-type, i-type, and p-type in the named order from the substrate, in thicknesses respectively of 150 Å, 4000 Å, 100 Å, 100 Å, 800 Å, and 100 Å. The light-transmissive film 15203 serves as the front electrode layer, and was formed, in this Example, by vapor deposition of indium in an $O_2$ atmosphere by resistance-heating as an indium oxide thin film of 700 Å thick.

The aforementioned insulating members 14105 were bonded onto the surface of the light-transmissive electroconductive film 15203. The insulating members 14105 were made from a polyester tape of several tens of μm which had been adhesively treated on the back face. On the insulating member 14105, the aforementioned terminal member 14104 was provided. The terminal member was prepared from a copper foil of 125 μm thick and 5.5 mm width which had been adhesively treated on the back face. The surface of the terminal ember was coated in a coating thickness of about 10 μm with the second electroconductive adhesive which is an epoxy resin containing powdered silver having a particle diameter of 1 to 3 μm dispersed therein, the resin being dried at 80° C., which is sufficiently lower than the curing initiation temperature of the epoxy resin (about 150° C.).

The application and drying of the adhesive on the terminal member was conducted simultaneously with the adhesive treatment on a terminal member material of large width of about 500 mm, and thereafter the material was slit into narrow pieces of prescribed width (5.5 mm), and the slit pieces were wound on a reel. The terminal members were cut from the reel in a prescribed length and were bonded to the prescribed position.

On the surface of the light-transmissive electroconductive film 15203 and on the surface of the electroconductive adhesive of the terminal member 14105, the collecting electrodes 14103 were continuously formed by hot-pressing to provide electrical connection between the light-transmissive electroconductive film 15203 and the electroconductive member 14103.

The collecting electrode wire 14103 was prepared by applying the first electroconductive adhesive 15206 in a thickness of about 15 μm, on the surface of a copper wire 15205 of 100 μm diameter, and drying the adhesive 15206 at 80° C. sufficiently lower than the curing initiation temperature (150° C.), and wound up with a bobbin. The first electroconductive adhesive 15206 employed was a urethane resin containing powdered carbon of several thousand Å diameter at a content of 35% by weight.

The collecting electrode wire was unwound from the bobbin, and was cut into pieces in a prescribed length. The collecting electrode wire pieces were arranged at a suitable spacing at the positions shown in FIG. 14, and the electrode wire pieces were bonded by hot-pressing in a vacuum press. The heating temperature was higher than the softening temperatures of the first electroconductive adhesive 15206 and the second electroconductive adhesive 15204, and higher than the curing temperatures of the above two electroconductive adhesives. Specifically, the heating was conducted at 150° C. for 2 minutes, and the pressure of 1 $kgf/cm^2$ was applied by vacuum suction. Thereby, the two electroconductive adhesives were melted together and then cured as shown in FIG. 16 to give mechanical and electrical connection with low resistance with high reliability.

As shown in FIG. 15, the terminal member 14106 of the counter electrode penetrates the light-transmissive electroconductive film 15203 and the semiconductor layer 15202 outside the etched groove 14102 and connects with the electroconductive substrate 15201 and the contact point 14106a. The contact point 14106a may be connected by supersonic welding, resistance welding, arc welding, and the like. In this Example ultrasonic welding was employed.

With the above constitution of the photovoltaic element, the collecting electrodes 14103 are capable of collecting the electric power generated by the semiconductor layer 15202 from the entire surface of the photovoltaic element through the light-transmissive electroconductive film 15203 to efficiently transmit the electric power to the terminal member 14104.

Table 7 shows the initial electrical properties of a solar cell of photovoltaic devices A and B.

TABLE 7

| | Photovoltaic device | | | |
|---|---|---|---|---|
| | A Comparative Ex. | B Ex. 4-1 | C Ex. 4-2 | D Ex. 4-3 |
| Effective efficiency η (%) | 7.70 | 7.82 | 7.90 | 7.88 |
| Series resistance (Ωcm$^2$) | 28.3 | 25.1 | 24.1 | 24.6 |
| Deterioration by 80 cycles of temperature-humidity cycle test | 3.6 | 1.3 | 0.8 | 0.7 |

The photovoltaic device A exhibited an effective efficiency η of 7.70%, and a series resistance of 28.3 Ωcm$^2$, while the photovoltaic device B exhibited an effective efficiency η of 7,82%, and a series resistance of 25.1 Ωcm$^2$. The higher effective efficiency and the lower series resistance are desirable. Therefore, the photovoltaic element B was superior to the device A in initial properties. Accordingly, the above photovoltaic devices of this Example having a combination of two electroconductive adhesives were satisfactory in initial properties.

The above devices were subjected to the temperature-humidity cycle test according to the SERI Standard of USA. The two photovoltaic devices exhibited a deterioration rate of nearly zero percent after 20 cycle tests specified by the Standard. After 80 cycles, which is much severer than the above Standard, the photovoltaic element A exhibited a deterioration rate of 3.6%, while that of the photovoltaic device B was 1.3%. Therefore, the durability was improved remarkably. Accordingly, the photovoltaic devices of this Example employing the two electroconductive adhesives in combination have been confirmed to be reliable for long-term use.

In this Example, copper was used as the core material of the collecting electrodes. However, any metal may be used which has a volume resistivity suitable for the purpose of the present invention. For instance, fine metal wire of silver or nickel is useful.

In this Example, one kind of electroconductive adhesive was applied on the peripheral surface of the copper wire. However, two or more kinds of electroconductive adhesives may be applied in layers.

EXAMPLE 4-2

Photovoltaic device C was prepared in the same manner as in Example 4-1 except that the first and the second electroconductive adhesives in Example 4-1 were respectively changed to another adhesive.

The first electroconductive adhesive in this Example was prepared by dispersing by mean of a shaker for a sufficient time carbon black having a diameter of several hundred nm in an acrylic type thermoplastic resin and a small amount of MEK for viscosity adjustment at a content of the carbon black of 30% by weight based on the acrylic resin. This first electroconductive adhesive was applied on the surface of a copper wire of 100 μm diameter, and dried at 80° C. to obtain a collecting electrode wire material.

The second electroconductive adhesive of this Example was a silver paste material which was prepared by dispersing powdered silver of about 5 μm diameter in the same acrylic type thermoplastic resin. This second electroconductive adhesive was applied in a thickness of 100 μm on copper foil for the terminal member, and was dried at 80° C.

Pieces of the collecting electrode wire were connected to the electrode fixation face and to the terminal members on which the second electroconductive adhesive had been applied. The connection was formed by heating at 150° C. under application of pressure of 1 kgf/cm$^2$ for 2 minutes, whereby the acrylic resins were melted together and cured on the portion of the terminal member to form a mechanical and electrical connection with low resistance and high reliability.

The photovoltaic device C employing the above two electroconductive adhesives in combination had an initial effective efficiency η of 7.90%, and a series resistance of 24.1 Ωcm$^2$ (Table 7). Therefore, the first electroconductive adhesive composed of the thermoplastic acrylic resin containing carbon black dispersed therein, and the second electroconductive adhesive composed of the silver paste which was prepared by dispersing powdered silver in the thermoplastic acrylic resin were considered to be useful without any problem in the initial performance. The photovoltaic device C was subjected to the same temperature-humidity cycle test as in Example 4-1. After 80 cycles of the test, the deterioration rate was found to be as low as 0.8%, which shows excellent performance in terms of long-term reliability.

EXAMPLE 4-3

Photovoltaic device D was prepared in the same manner as in Example 4-1 except that the first and the second electroconductive adhesives in Example 4-1 were respectively changed to another adhesive.

The first electroconductive adhesive in this Example was prepared by dispersing by means of a shaker for a sufficient time carbon black having diameter of several hundred nm in an acrylic type thermoplastic resin and a small amount of MEK for viscosity adjustment at a content of the carbon black of 30% by weight based on the acrylic resin. Separately from the first electroconductive adhesive, a carbon paste material was prepared by dispersing fine particulate carbon of several hundred nm diameter in an epoxy resin at a particulate carbon content of 35% by weight.

On the surface of a copper wire of 100 μm diameter, the above carbon-epoxy resin paste material was applied in a thickness of 5 μm, and cured at 150° C. Thereon, the above first electroconductive adhesive was applied in a thickness of 10 μm, and dried at 80° C. to obtain a collecting electrode material. The carbon-epoxy paste was provided for the purpose of inhibiting metal ion migration form the copper wire to the electroconductive adhesive.

The second electroconductive adhesive of this Example was a silver paste material which was prepared by dispersing powdered silver of about 5 μm diameter in the same acrylic type thermoplastic resin as the one used for the first electroconductive adhesive. This second electroconductive adhesive was applied in a thickness of 100 μm on the surface of a copper foil material for the terminal member in a thickness of 100 μm and was dried at 80° C.

Pieces of the collecting electrode wire obtained above were connected to the electrode fixation face and to the terminal member on which the second electroconductive adhesive had been applied. The connection was made by heating at 150° C. under application of pressure of 1 kgf/cm$^2$ for 2 minutes, whereby the acrylic resins were melted together and cured on the portion of the terminal member to form a mechanical and electrical connection with low resistance and high reliability.

The photovoltaic device D employing the above two electroconductive adhesives in combination had an initial effective efficiency η of 7.88%, and a series resistance of 24.6 Ωcm² (Table 7). Therefore, the first electroconductive adhesive composed of the thermoplastic acrylic type resin containing carbon black dispersed therein, the second electroconductive adhesive composed of the silver paste which was prepared by dispersing powdered silver in the thermoplastic acrylic type resin, and the carbon-epoxy paste layer provided between the copper wire and the first electroconductive adhesive were considered to be useful without any problem in the initial performance. The photovoltaic device D was subjected to the same temperature-humidity cycle test as in Example 4-1. After 80 cycles of the test, the deterioration rate was found to be as low as 0.7%, which shows excellent performance in terms of the long-term reliability.

According to the above method, the step of application of an electroconductive adhesive after the electrode formation, which is necessary as in Comparative Example, can be omitted, and the production cost is greatly reduced. Although the electroconductive adhesive needs to be applied onto the terminal member in a separate process, the application of the adhesive can be conducted collectively with a plurality of articles, whereby the working steps are notably decreased. Furthermore, since the connection is conducted by hot-pressing, the subsequent heat-treating step may be omitted.

As also shown in the above Examples, the electroconductive adhesive functions sufficiently in a thin film state, which enables reduction of the amount of the electroconductive adhesive used.

The surface coating material can be made thin since the electroconductive adhesive applied on the terminal member does not protrude higher than the electrodes.

As also shown in the above Examples, because the electroconductive adhesive for the connection may be prepared by use of a less corrosive metal like silver, the reliability of the connection can be maintained for a long term. Furthermore, the electroconductive adhesive protects the entire surface of the terminal members formed from oxidizable metal like copper, preventing the terminal members against oxidation during the heat treatment in the production process, nullifying adverse effects caused by oxidation after production, and ensuring reliability in comparison with the prior art.

The electroconductive adhesive is applied to the terminal members separately from the electrode formation steps. Consequently, the production efficiency per unit time can be raised, and the production cost can be reduced.

As shown in the above Examples, the respective electrodes are collectively fixed on the light-receiving face of the photovoltaic element. Thereby, the fixation of the contact points is made uniform and reliable, and the assembling process of the photovoltaic element can be simplified to reduce the production costs.

Accordingly, the present invention enables simplification of the production process and the production apparatus of the photovoltaic element, and enables a reduction in the use of the materials such as the electroconductive adhesive and the surface coating materials.

Examples 5-1 to 5-3 below demonstrate that the production apparatus and the production process employing the collecting electrodes of the present invention improve the yield and the reliability of the photovoltaic element in mass production.

EXAMPLE 5-1

A thermosetting electroconductive adhesive for coating the metal wire was prepared by dispersing 35 parts by weight of carbon black, 59 parts by weight of a urethane resin as a binder, and 9.5 parts by weight of an isocyanate as a curing agent, in a solvent mixture of 12 parts by weight of butyl ether acetate and 8 parts by weight of methyl ethyl ketone. The electroconductive adhesive after drying had a softening temperature of 110° C.

The electroconductive adhesive was applied on a copper wire of 100 μm diameter by passing the wire through the electroconductive adhesive by means of a wire-coating apparatus assembled by the inventors of the present invention, and the applied electroconductive adhesive was dried at 120° C. by infrared dryer.

Figure 21:
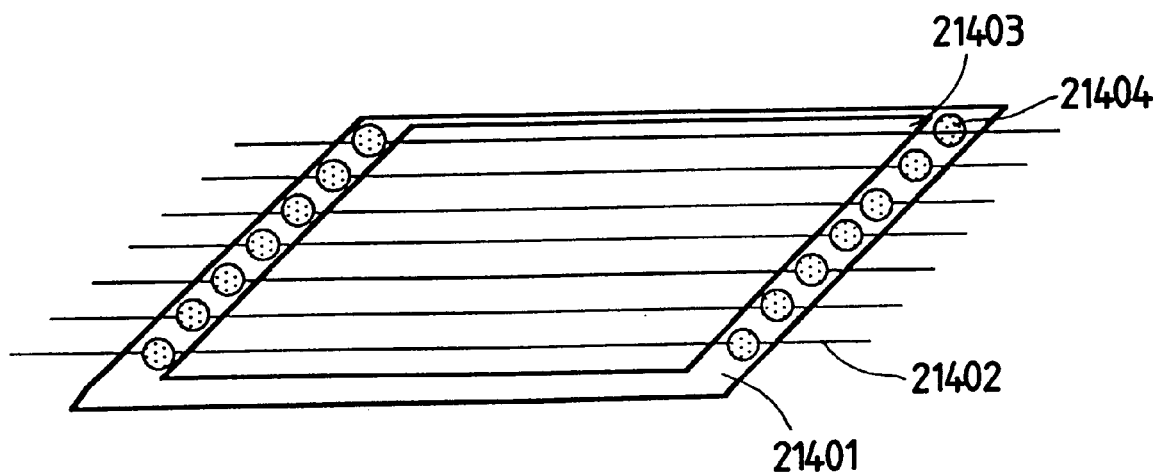
FIG. 21 illustrates schematically a process for formation of an electrode of the present invention.
Figure 24A:
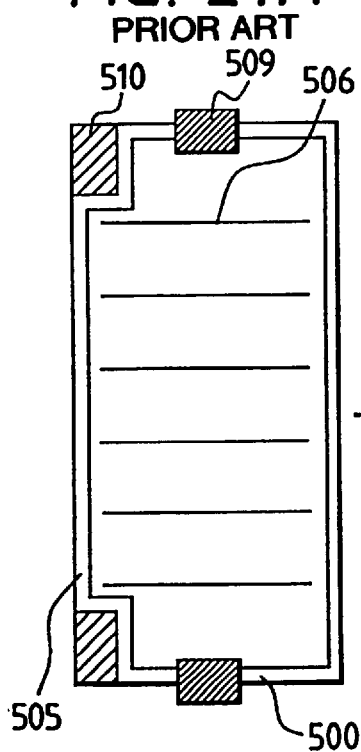
FIGS. 24A to 24D illustrate a prior art photovoltaic module for comparison.
Figure 24B:
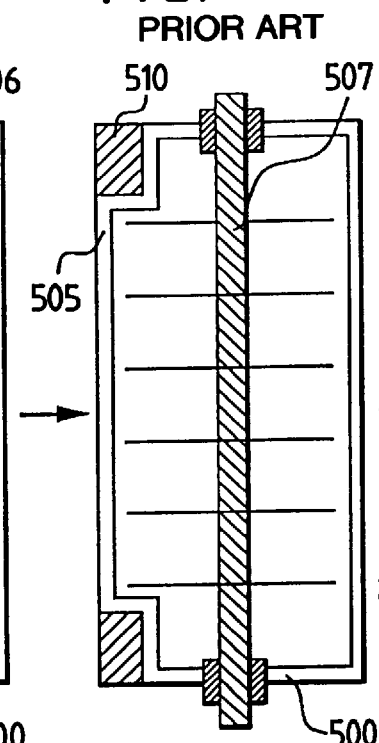
Figure 24C:
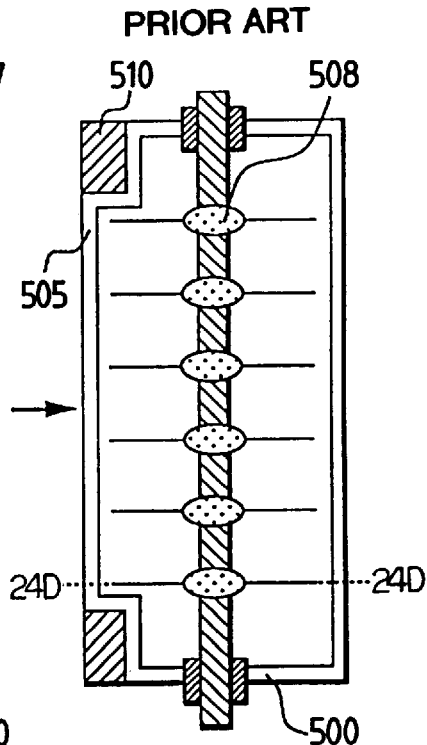
Figure 24D:
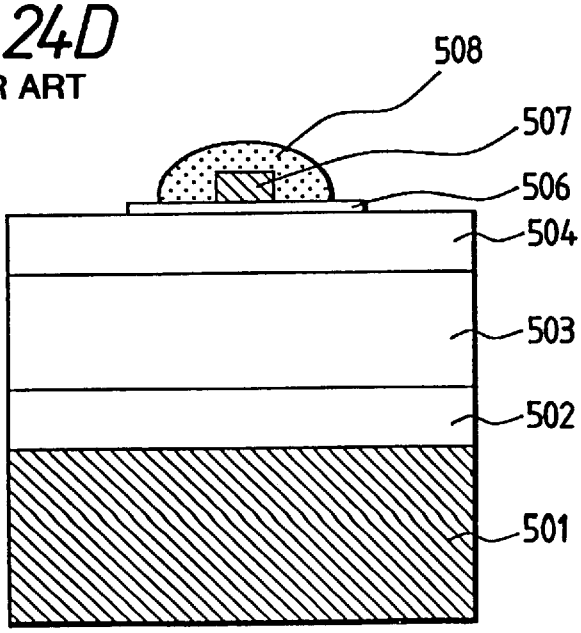

The pieces of the coated wire 21402 were placed at the positions of the collecting electrode formation on a photovoltaic element 21401 having an effective area of 30 cm×35 cm as shown in FIG. 21. The wire pieces were fixed at the points outside the etched groove 21403 on the photovoltaic element with application of tension to the both ends of the respective wire pieces by use of an instantaneous adhesive or an ultraviolet-curing adhesive 21404. The photovoltaic element having the wire pieces fixed thereon was placed on a heating plate 18101 of a vacuum hot press shown in FIG. 18 with the collecting electrode formation face oriented upward. The upper chamber 18106 was evacuated through a vent 18108, and a lower chamber 18107 through a vent 18109. Thereafter, air was introduced into the upper chamber 18106 through an air hole 18110 to press the wire pieces by atmospheric pressure on the heating plate at a temperature of 200° C. for 30 seconds. The solar cell properties of the resulting element were measured according to JIS C8913 (measurement of output of crystalline type solar cell) with a simulated global sunlight spectrum of AM 1.5 at a light intensity of 100 mW/cm². The results are shown in Table 8.

Comparative Example 5-1

Collecting electrodes were formed in the same manner as in Example 5-1 except that the electrode formation face was directed downward on the heating plate 18101 of the vacuum hot press. The solar cell properties of the resulting element were evaluated in the same manner as in Example 5-1. The results are shown in Table 8.

The cross sections of the electrode portions of Example 5-1 and Comparative Example 5-1 after the electrode formation were observed by an optical microscope. FIG. 22A shows schematically the cross-section of the one of Example 5-1, and FIG. 22B shows that of Comparative Example 5-1, where the numeral 22501 indicates the electroconductive adhesive; 22502 a metal wire; and 22503 a photovoltaic element.

As shown in Table 8 and FIGS. 22A and 22B, the sample of Example 5-1 had lower shadow loss and series resistance, and the conversion efficiency was higher by about 25% than that of Comparative Example 5-1. This would be caused by the fact that, in Comparative Example 5-1, the electroconductive adhesive in contact with the heating plate was excessively softened and flattened, and did not adhere sufficiently onto the electrode formation face in comparison with the electroconductive adhesive in Example 5-1.

TABLE 8

|  | Conversion efficiency (%) | Series resistance ($\Omega cm^2$) | Short-circuit current Jsc (mA/cm$^2$) |
|---|---|---|---|
| Example 5-1 | 8.0 | 24 | 7.0 |
| Comparative Example 5-1 | 6.0 | 53 | 5.9 |

EXAMPLE 5-2

Collecting electrodes were formed by using the same coated wire and the same photovoltaic element as in Example 5-1 with a hot press shown in FIG. 19.

The coated wire pieces under application of tension thereto were fixed on the photovoltaic element. The element was placed on a heating plate 19201 of the hot press shown in FIG. 19 with the collecting electrode formation face directed upward, and pressed from the upper side at a pressure of 1 kg/cm$^2$ with heating by the heating plate to a temperature of 250° C. for 30 seconds. The end portions of the wire pieces were cut off. The photovoltaic element was evaluated in the same manner as in Example 5-1. The results are shown in Table 9.

Separately, another photovoltaic element was prepared in the same manner as above except that the silicone rubber sheet 19205 was not used, and it was evaluated in the same manner as above. The results are shown in Table 9.

TABLE 9

|  | Conversion efficiency (%) | Series resistance ($\Omega cm^2$) | Short-circuit current Jsc ($\Omega/cm^2$) |
|---|---|---|---|
| Rubber used | 8.0 | 25 | 7.0 |
| Rubber not used | 7.2 | 33 | 6.8 |

As shown in Table 8, when the silicone rubber was used, the pressure was applied uniformly to the collecting electrodes, whereby the electroconductive adhesive adhered uniformly on the electrode formation face. Consequently, the series resistance was lower, giving a conversion efficiency about 10% higher.

As shown above, use of an elastic resin like silicone rubber for pressure application enables uniform adhesion.

EXAMPLE 5-3

Collecting electrodes were formed on a photovoltaic element having a larger area 60 cm×35 cm, i.e., twice as that in Examples 5-1 and 5-2 by means of a hot press shown in FIG. 20. The coated wire and the photovoltaic element were the same, except for the increased size of the light-receiving area.

The coated wire pieces under application of tension thereto were fixed on the photovoltaic element. The element was placed on a heating plate 20301 of the hot press shown in FIG. 20 with the collecting electrode formation face directed upward, and pressed from the upper side by driving a roller 20304 at a pressure of 10 kg/cm$^2$ with heating of the electrode formation face by the heating plate to a temperature of 250° C. The resulting photovoltaic element was evaluated in the same manner as in Example 5-1. The results are shown in Table 10.

For comparison, the same photovoltaic element was prepared by employing the hot press shown in FIG. 18. The coated wire pieces under application of tension thereto were fixed on the large-area photovoltaic element. The element was placed on the heating plate 18101 of the hot press shown in FIG. 18 with the collecting electrode formation face directed upward, and pressed from the upper side at a pressure of 1 kg/cm$^2$ with heating of the electrode formation face by the heating plate to a temperature of 250° C. for 30 seconds. The end portions of the wire pieces were cut off. The photovoltaic element was evaluated in the same manner as in Example 5-1. The results are shown in Table 10.

As shown in Table 9, in the case where the photovoltaic element is larger, lower series resistance and higher conversions efficiency can be achieved by use of a roller for pressure application. This is considered to be due to the uniform pressure application over the entire element achieved by the use of the roller, even if the element has a larger area, to give uniform adhesion of the electroconductive adhesive on the electrode formation face.

TABLE 10

|  | Conversion efficiency (%) | Series resistance ($\Omega cm^2$) | Short-circuit current Jsc (mA/cm$^2$) |
|---|---|---|---|
| Roller type | 7.9 | 26 | 7.0 |
| Plate type | 7.2 | 35 | 6.8 |

As described above, the width of the collecting electrodes can be made small and the shadow loss can be decreased by forming the collecting electrodes by placing collecting-electrode wire pieces on a photovoltaic element, applying pressure to the collecting electrode, and heating the photovoltaic element from the opposite side. As a result of the uniform pressure application by the above method, the metal wire pieces are bonded over their entire lengths to give a low series resistance and a high conversion efficiency.

Further, more satisfactory performance can be obtained by selecting the temperature of heating the electroconductive adhesive in the range from the softening temperature thereof to 150° C. higher than that, and/or applying pressure in the range from 1 kg/cm$^2$ to 10 kg/cm$^2$.

The reliability is further improved by applying the a rust prevention treatment to the metal wire as described in Examples 2-1 to 2-8 and the coupling treatment as described in Examples 3-1 to 3-8 prior to formation of the photovoltaic device by the procedure as shown in Examples 4-1 to 4-3, and 5-1 to 5-3.

What is claimed is:

1. A photovoltaic device comprising a photovoltaic element comprising a semiconductor layer for photoelectric conversion and an electrode on the light-receiving surface of the semiconductor layer for collecting electric power generated by the semiconductor layer, wherein the electrode comprises at least one metal wire coated with at least one layer of a first electroconductive adhesive by application and drying, and is fixed on the light-receiving surface of the photovoltaic element by pressing, hot-pressing, or heating; a terminal member is provided for outputting the electric power collected by the electrode on the light receiving surface of the photovoltaic element; the electrode is also fixed onto the surface of the terminal member; and the terminal member is preliminarily coated with a second electroconductive adhesive at least at the electrode fixation portion.

2. The photovoltaic device according to claim 1, wherein the terminal member is made of a metal comprising copper.

3. The photovoltaic device according to claim 1, wherein the first electroconductive adhesive is a high polymer resin containing powdered carbon dispersed therein.

4. The photovoltaic device according to claim 1, wherein the second electroconductive adhesive is a high polymer resin containing a powdered material comprising silver or a powdered alloy coated with silver on the surface thereof.

5. The photovoltaic device according to claim 1, wherein the metal wire further has a rust preventive layer under the coated electroconductive adhesive.

6. The photovoltaic device according to claim 5, wherein the rust preventive layer is formed by exposing the surface of the metal wire to one selected from the group consisting of imidazole compounds, triazole compounds, and mercaptan compounds.

7. The photovoltaic device according to claim 1, wherein the metal wire further has a coupling agent layer under the coated electroconductive adhesive.

8. The photovoltaic device according to claim 7, wherein the coupling agent layer is formed by exposing the surface of the metal wire to one selected from the group consisting of silane coupling agents, titanate coupling agents, and aluminum coupling agents.

9. A process for producing a photovoltaic device comprising a photovoltaic element comprising a semiconductor layer for photoelectric conversion and an electrode on the light receiving surface thereof for collecting electric power generated by the semiconductor layer, which comprises the steps of applying to at least one metal wire at least one layer of a first electroconductive adhesive and drying the coated metal wire; fixing the at least one metal wire as the electrode on the light-receiving surface of the photovoltaic element by pressing, hot-pressing, or heating; fixing the metal wire also to a terminal member for outputting the electric power collected by the electrode on the surface of the photovoltaic element; and preliminarily applying a second electroconductive adhesive to the terminal member at least at the electrode fixation portion.

10. A photovoltaic device having an electric power-generating region and a non-electric power-generating region comprising:

a substrate having an electroconductive surface;

a semiconductor layer provided on the electroconductive surface of the substrate in both the electric power-generating region and the non-electric power-generating region;

a transparent electrode provided on the semiconductor layer in both the electric power-generating region and the non-electric power-generating region, both regions being electrically insulated from each other by a separation groove in the transparent electrode;

an insulating member provided on the transparent electrode of the non-electric power-generating region;

a terminal member provided on the transparent electrode of the non-electric power-generating region, thereby sandwiching the insulating member between the terminal member and the transparent electrode; and a metal wire coated with a first electroconductive adhesive and connected with the transparent electrode of the electric power-generating region, the metal wire being electrically connected with the terminal member.

11. The photovoltaic device according to claim 10, wherein the terminal member comprises at least a metal selected from the group consisting of copper and silver.

12. The photovoltaic device according to claim 10, wherein the first electroconductive adhesive is a polymerized resin having powdered carbon dispersed therein.

13. The photovoltaic device according to claim 10, wherein at least a connection portion between the terminal member and the metal wire is coated with a second electroconductive adhesive.

14. The photovoltaic device according to claim 13, wherein the second electroconductive adhesive is a polymerized resin containing a powdered material comprising silver or a powdered alloy coated with silver.

15. The photovoltaic device according to claim 10, wherein the insulating member comprises a double-coated tape.

16. A process for producing a photovoltaic device having an electric power-generating region and a non-electric power-generating region comprising the steps of:

providing a substrate having an electroconductive surface;

forming a semiconductor layer on the electroconductive surface of the substrate in both the electric power-generating region and the non-electric power-generating region;

forming a transparent electrode on the semiconductor layer in both the electric power-generating region and the non-electric power-generating region;

electrically insulating the electric power-generating region and the non-electric power-generating region from each other by removing the transparent electrode between both regions by etching;

forming an insulating member on the transparent electrode of the non-electric power-generating region;

forming a terminal member on the transparent electrode of the non-electric power-generating region, thereby sandwiching the insulating member between the terminal member and the transparent electrode;

arranging a metal wire coated with a first electroconductive adhesive on the transparent electrode of the electric power-generating region and the terminal member of the non-electric power-generating region; and electrically connecting the metal wire with the transparent electrode of the electric power-generating region and the terminal member of the non-electric power-generating region by hot-pressing.

17. The process for producing a photovoltaic device according to claim 16, wherein the step of removing a part of the transparent electroconductive layer is carried out by printing an etching agent on the part and removing the part with the agent by cleaning.

18. The process for producing a photovoltaic device according to claim 16, wherein the terminal member is coated with a second electroconductive adhesive.

19. The process for producing a photovoltaic device according to claim 16, further comprising treating the metal wire with a rust-preventing agent before coating the metal wire with the first electroconductive adhesive.

20. The process for producing a photovoltaic device according to claim 19, wherein the rust-preventing agent is one selected from the group consisting of imidazole compounds, triazole type compounds and mercaptan compounds.

21. The process for producing a photovoltaic device according to claim 16, further comprising coating the metal wire with a coupling agent prior to coating the metal wire with the first electroconductive adhesive.

22. The device producing a photovoltaic device according to claim 21, wherein the coupling agent is one selected from the group consisting of silane coupling agents, titanate coupling agents, and aluminum coupling agents.

23. The process according to claim 16, wherein the electrical connections between the metal wire and the transparent electrode of the electric power-generating region and between the metal wire and the terminal member metal wire of the non-electric power-generating region are carried out at the same time by hot-pressing.

* * * * *

UNITED STATES PATENT AND TRADEMARK OFFICE
CERTIFICATE OF CORRECTION

PATENT NO. : 5,942,048
DATED : August 24, 1999
INVENTOR(S) : TATSUO FUJISAKI ET AL.

It is certified that error appears in the above-identified patent and that said Letters Patent is hereby corrected as shown below:

ON THE TITLE PAGE

[54] IN THE TITLE:

"ELEMENT" should read --ELEMENT,--; and
"THEREOF" should read --THEREOF,--.

[30] Foreign Application Priority Data

"Jun.23, 1994 [JP] Japan .....6-108113" should read
--May 23, 1994 [JP] Japan .....6-108113--.

IN THE DRAWINGS

SHEET 7 OF 14, FIG. 12:
"COMARATIVE" should read --COMPARATIVE--; and

SHEET 8 OF 14, FIG. 13:
"COMARATIVE" should read --COMPARATIVE--.

COLUMN 1

Line 1, "ELEMENT" should read --ELEMENT,--; and
Line 2, "THEREOF" should read --THEREOF,--.

COLUMN 2

Line 58, "the width" should read --width--.

COLUMN 3

Line 54, "electrode 17402" should read --electrodes 17402--.

UNITED STATES PATENT AND TRADEMARK OFFICE
CERTIFICATE OF CORRECTION

PATENT NO. : 5,942,048
DATED : August 24, 1999
INVENTOR(S) : TATSUO FUJISAKI ET AL.

It is certified that error appears in the above-identified patent and that said Letters Patent is hereby corrected as shown below:

COLUMN 4

Line 62, "light transmissive" should read --light-transmissive--.

COLUMN 5

Line 57, "an metal" should read --a metal--; and
Line 61, "junction of" should read --junction--.

COLUMN 6

Line 40, "was" should be deleted;
Line 53, "electrodes," should read --electrodes--; and
Line 54, "by comparison," should be deleted, and "electrodes" should read --.

COLUMN 7

Line 2, "light transmissive" should read --light-transmissive--.

COLUMN 9

Line 22, "Investigation" should read --investigation--.

COLUMN 12

Line 16, "1-3." should read --1-3. Metal Wires--.

COLUMN 13

Line 1, "Agent" should read --Agents--.

UNITED STATES PATENT AND TRADEMARK OFFICE
CERTIFICATE OF CORRECTION

PATENT NO.    : 5,942,048

DATED         : August 24, 1999

INVENTOR(S)   : TATSUO FUJISAKI ET AL.

It is certified that error appears in the above-identified patent and that said Letters Patent is hereby corrected as shown below:

COLUMN 14

Line 17, "Sno$_2$," should read --SnO$_2$,--.

COLUMN 16

Line 2,  "coating" should read --coatings--;
Line 12, "(FIGS. 6-7" should read --(FIGS. 6-7).--;
Line 13, ")" should be deleted; and
Line 43, "amorphous" should read --an amorphous--.

COLUMN 17

Line 56, "bay" should read --may--.

COLUMN 18

Line 29, "Kogyo)," should read --Kogyo).--.

COLUMN 19

Line 46, "structure of" should be deleted.

COLUMN 20

Line 38, "locally," should read --locally--;
Line 50, "electrode" should read --the electrode--; and
Line 51, "upwards" should read --upward--.

COLUMN 21

Line 9,  "collecting" should read --a collecting--;
Line 27, "Then" should read --Then,--;

UNITED STATES PATENT AND TRADEMARK OFFICE
CERTIFICATE OF CORRECTION

PATENT NO. : 5,942,048

DATED : August 24, 1999

INVENTOR(S) : TATSUO FUJISAKI ET AL.

It is certified that error appears in the above-identified patent and that said Letters Patent is hereby corrected as shown below:

COLUMN 21

Line 36, "power generation" should read --power-generation--.

COLUMN 22

Line 37, "Table" should read --¶ Table--.

COLUMN 23

Line 16, "except" should read --except for--;
    Line 29, "were" should read --was--;
    Line 44, "step" should read --steps--; and
    Line 55, "except" should read --except for--.

COLUMN 24

Line 23, "the" should be deleted;
    Line 27, "long term" should read --long-term--; and
    Line 37, "an" should be deleted.

COLUMN 26

Line 33, "were" should read --was--.

COLUMN 30

Line 57, "the" should be deleted.

COLUMN 31

Line 49, "n-type 9403," should read --n-layer 9403,--; and

UNITED STATES PATENT AND TRADEMARK OFFICE
CERTIFICATE OF CORRECTION

PATENT NO.   : 5,942,048
DATED        : August 24, 1999
INVENTOR(S)  : TATSUO FUJISAKI ET AL.

It is certified that error appears in the above-identified patent and that said Letters Patent is hereby corrected as shown below:

COLUMN 31

Line 53, "film 9406" should read --film 9406--.

COLUMN 33

Line 33, close up left margin;
    Line 34, close up right margin; and
    Line 45, "Then" should read --Ten--.

COLUMN 35

Line 62, "ember" should read --member--.

COLUMN 37

Line 21, "7,82%" should read --7.82%--.

COLUMN 38

Line 48, "form" should read --from--.

COLUMN 40

Line 21, "the both" should read --both--.

COLUMN 41

Line 38, "Table 8," should read --Table 9,--; and

COLUMN 42

Line 8, "Table 9," should read --Table 10,--.

UNITED STATES PATENT AND TRADEMARK OFFICE
CERTIFICATE OF CORRECTION

PATENT NO. : 5,942,048
DATED : August 24, 1999
INVENTOR(S) : TATSUO FUJISAKI ET AL.

Page 6 of 6

It is certified that error appears in the above-identified patent and that said Letters Patent is hereby corrected as shown below:

COLUMN 44

Line 50, "type" should be deleted.

Signed and Sealed this

Third Day of October, 2000

*Attest:*

Q. TODD DICKINSON

*Attesting Officer*     *Director of Patents and Trademarks*